(12) United States Patent
Yeh

(10) Patent No.: US 11,626,360 B2
(45) Date of Patent: Apr. 11, 2023

(54) SEMICONDUCTOR DEVICE PACKAGE AND METHOD FOR MANUFACTURING THE SAME

(71) Applicant: Advanced Semiconductor Engineering, Inc., Kaohsiung (TW)

(72) Inventor: Chang-Lin Yeh, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 5 days.

(21) Appl. No.: 17/486,829

(22) Filed: Sep. 27, 2021

(65) Prior Publication Data

US 2022/0013443 A1  Jan. 13, 2022

Related U.S. Application Data

(63) Continuation of application No. 16/446,559, filed on Jun. 19, 2019, now Pat. No. 11,133,244.

(51) Int. Cl.
*H01L 21/48* (2006.01)
*H01L 23/498* (2006.01)
*H01L 25/16* (2023.01)

(52) U.S. Cl.
CPC .... *H01L 23/49816* (2013.01); *H01L 21/4853* (2013.01); *H01L 23/49822* (2013.01); *H01L 25/16* (2013.01)

(58) Field of Classification Search
CPC ............... H01L 23/49816; H01L 21/4853
See application file for complete search history.

(56) References Cited

U.S. PATENT DOCUMENTS

| | | | |
|---|---|---|---|
| 7,154,166 B2 | 12/2006 | Ano | |
| 9,905,491 B1* | 2/2018 | Yoon | H01L 23/3128 |
| 10,269,584 B2 | 4/2019 | Chiu et al. | |
| 2008/0315385 A1 | 12/2008 | Gerber et al. | |
| 2010/0072600 A1* | 3/2010 | Gerber | H01L 23/3128 |
| | | | 257/737 |
| 2013/0187246 A1* | 7/2013 | Adkisson | H01L 24/05 |
| | | | 438/51 |

(Continued)

OTHER PUBLICATIONS

Non-Final Office Action for U.S. Appl. No. 16/446,559, dated Jan. 4, 2021, 10 pages.

(Continued)

*Primary Examiner* — Thao P Le
(74) *Attorney, Agent, or Firm* — Foley & Lardner LLP

(57) ABSTRACT

A semiconductor device package includes a first substrate, a second substrate, a conductive structure, a first solder and a second solder. The second substrate is disposed over the first substrate. The conductive structure is disposed between the first substrate and the second substrate. The conductive structure includes a first wetting portion, a second wetting portion, and a non-wetting portion disposed between the first wetting portion and the second wetting portion. The first solder covers the first wetting portion and connects the conductive structure to the first substrate. The second solder covers the second wetting portion and connects the conductive structure to the second substrate. The first solder is spaced apart from the second solder by the non-wetting portion.

20 Claims, 27 Drawing Sheets

(56) References Cited

U.S. PATENT DOCUMENTS

| | | | |
|---|---|---|---|
| 2013/0260534 A1* | 10/2013 | Khanna | H01L 24/75 |
| | | | 438/457 |
| 2014/0061897 A1 | 3/2014 | Lin et al. | |
| 2014/0319692 A1* | 10/2014 | Pendse | H05K 1/111 |
| | | | 438/126 |
| 2015/0255366 A1 | 9/2015 | Chung | |
| 2015/0357272 A1* | 12/2015 | Shen | H01L 23/3121 |
| | | | 438/126 |
| 2016/0148864 A1* | 5/2016 | Fu | H01L 24/92 |
| | | | 257/692 |
| 2016/0358876 A1 | 12/2016 | Kuo et al. | |
| 2017/0236724 A1* | 8/2017 | Chang | H01L 24/92 |
| | | | 438/15 |
| 2018/0005976 A1 | 1/2018 | Lin et al. | |
| 2019/0221445 A1 | 7/2019 | Chiu et al. | |
| 2020/0402897 A1* | 12/2020 | Yeh | H01L 23/49822 |

OTHER PUBLICATIONS

Notice of Allowance for U.S. Appl. No. 16/446,559, dated May 28, 2021, 8 pages.

* cited by examiner

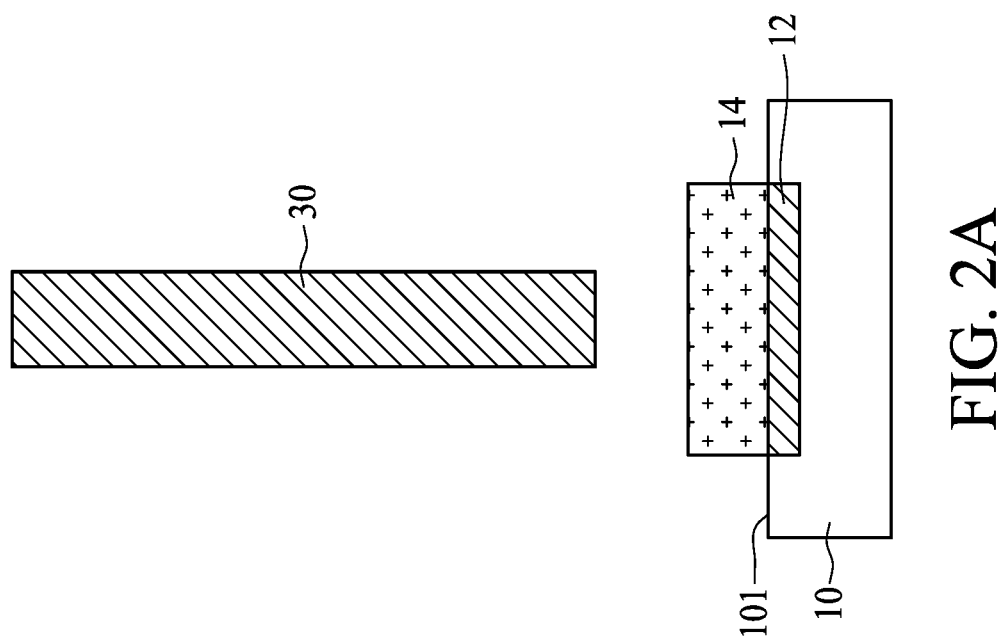

SEMICONDUCTOR DEVICE PACKAGE AND METHOD FOR MANUFACTURING THE SAME

CROSS-REFERENCE TO RELATED APPLICATIONS

The present application is a continuation of and claims priority to U.S. application Ser. No. 16/446,559 filed Jun. 19, 2019, now U.S. Pat. No. 11,133,244, the contents of which are incorporated by reference herein in their entirety.

BACKGROUND

1. Technical Field

The present disclosure relates to a semiconductor device package and a method for manufacturing the same, and more particularly to a semiconductor device package including a conductive structure with non-wetting portion and a method for manufacturing the same.

2. Description of the Related Art

A stacked semiconductor device package such as package on package (POP) or package in package (PIP) may include two or more packages stacked to one another. The packages each may include a substrate with one or more electronic components disposed thereon, and the substrates of the stacked packages are electrically connected through solder material such as solder ball. The stacked semiconductor device package is adopted to reduce the size and to increase the integration density of the package. The solder balls, however, have low tolerance to the gap variation between the substrates, and thus the stacked semiconductor device package may suffer from short-circuitry or open-circuitry, low yield and necking issue, particularly when warpage of the stacked semiconductor device package occurs.

SUMMARY

In some embodiments, a semiconductor device package includes a first substrate, a second substrate, a conductive structure, a first solder and a second solder. The second substrate is disposed over the first substrate. The conductive structure is disposed between the first substrate and the second substrate. The conductive structure includes a first wetting portion, a second wetting portion, and a non-wetting portion disposed between the first wetting portion and the second wetting portion. The first solder covers the first wetting portion and connects the conductive structure to the first substrate. The second solder covers the second wetting portion and connects the conductive structure to the second substrate. The first solder is spaced apart from the second solder by the non-wetting portion.

In some embodiments, a semiconductor device package includes a first substrate, a second substrate and a conductive structure. The first substrate includes a first surface. The second substrate is disposed over the first surface of the first substrate. The second substrate includes a second surface facing the first surface of the first substrate. The conductive structure is disposed between and electrically connected to the first substrate and the second substrate. The conductive structure includes a first section electrically connected the first substrate, a second section electrically connected the second substrate, and a step section separating the first section from the second section.

In some embodiments, a method for manufacturing a semiconductor device package includes the following operations. A conductive structure is received. The conductive structure is bonded to a substrate with a first solder. A surface treatment is performed on the conductive structure exposed from the first solder to form a wetting portion and a non-wetting portion between the first solder and the wetting portion. The conductive structure is bonded to another substrate with a second solder covering the wetting portion and spaced apart from the first solder by the non-wetting portion.

BRIEF DESCRIPTION OF THE DRAWINGS

Aspects of some embodiments of the present disclosure are readily understood from the following detailed description when read with the accompanying figures. Various structures may not be drawn to scale, and the dimensions of the various structures may be arbitrarily increased or reduced for clarity of discussion.

FIG. 2A, FIG. 2B, FIG. 2C, FIG. 2D, FIG. 2E, FIG. 2F and FIG. 2G illustrate operations for manufacturing a semiconductor device package in accordance with some embodiments of the present disclosure.

DETAILED DESCRIPTION

Figure 1:
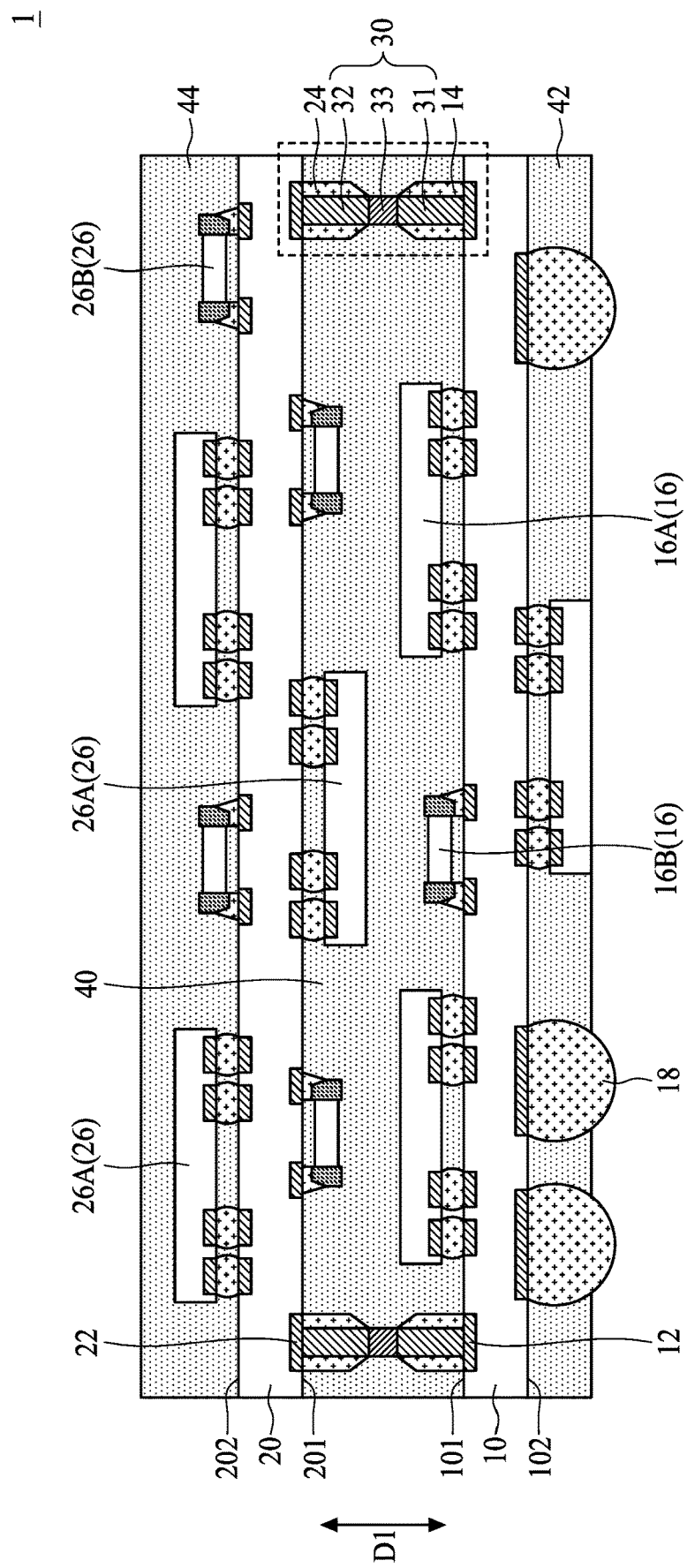
FIG. 1 is a side view of a semiconductor device package in accordance with some embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

The present disclosure provides for a semiconductor device package and a method for manufacturing the same. The semiconductor device package includes two or more stacked substrates, and a conductive structure disposed between and electrically connected to substrates. The conductive structure includes wetting portions covered with solder materials, and a non-wetting portion between the wetting portions. The non-wetting property of the non-wetting portion can help repel the solder materials covering the wetting portions from contacting each other and constrain the solder materials in the wetting portions, such that open-circuitry and/or short-circuitry can be alleviated or avoided. The solder materials covering different wetting portions may have different melting points, such that one of the solder materials formed formerly may not be melted during formation of another one of the solder material formed later, and open-circuitry and/or short-circuitry can be alleviated or avoided.

Figure 1A:
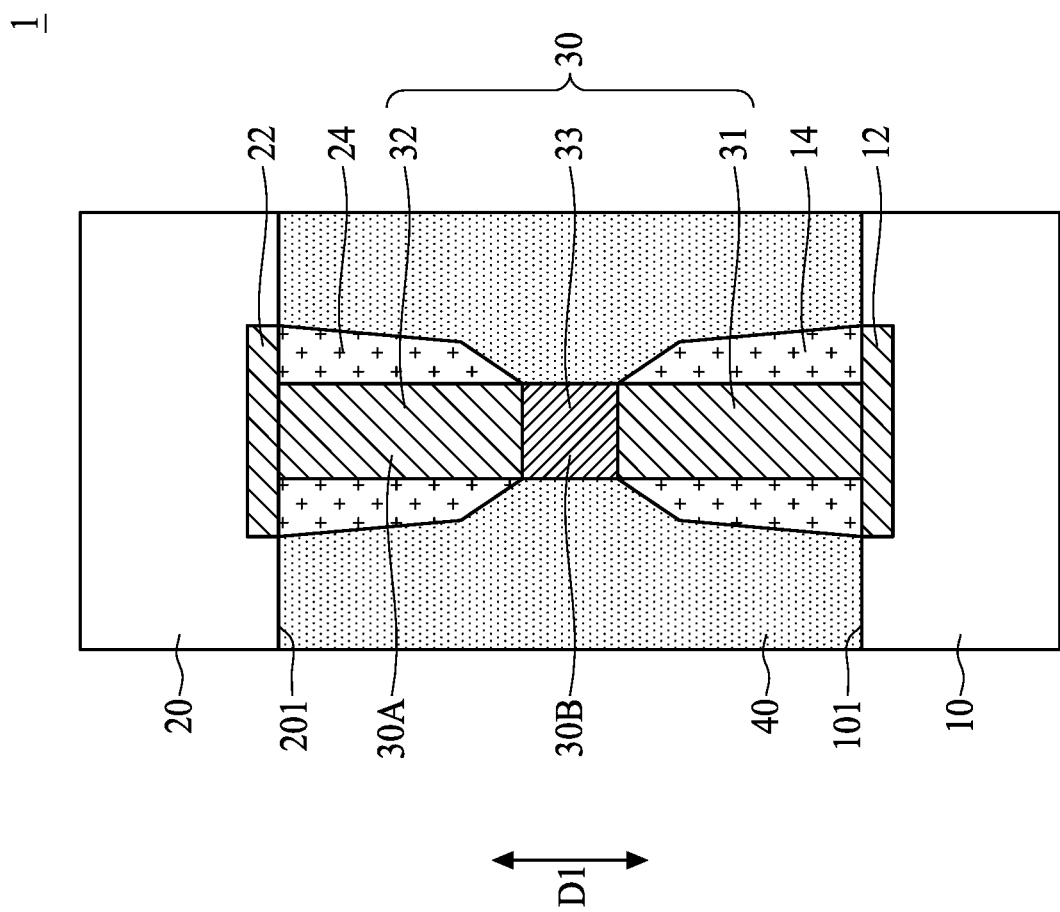
FIG. 1A is an enlarged side view of a semiconductor device package of FIG. 1.

FIG. 1 is a side view of a semiconductor device package 1 in accordance with some embodiments of the present disclosure, and FIG. 1A is an enlarged side view of a semiconductor device package 1 of FIG. 1. As shown in FIG. 1 and FIG. 1A, the semiconductor device package 1 includes a first substrate 10, a second substrate 20, and a conductive structure 30. The second substrate is disposed over the first substrate 10. The first substrate 10 includes a first surface 101, and the second substrate 20 includes a second surface 201 facing and apart from the first surface 101 of the first substrate 10. The first substrate 10 may include a package substrate such as a circuit board. By way of example, the first substrate 10 may include one or more dielectric layers, one or more circuit layers, and one or more first conductive pads 12 disposed on the dielectric layer(s). The material of the dielectric layer may include, but is not limited to, resin such as epoxy, bismaleimide triazine (BT) or the like, glass fiber such as FR-4 or the like, semiconductor, ceramic, glass, plastic or other suitable materials. The circuit layer(s) may include redistribution layer (RDL), through vias, conductive traces, conductive wires or the like. The circuit layer(s) may be disposed in the dielectric layer(s), on the dielectric layer(s) 11 or between adjacent dielectric layer(s). The material of the circuit layer(s) may include, but is not limited to, metal such as copper (Cu) or the like. The first conductive pad 12 is disposed in proximity to, adjacent to or embedded in and exposed by the dielectric layer, and configured to receive the conductive structure 30. The first conductive pad 12 may be electrically connected to the circuit layer(s) of the first substrate 10. The material of the first conductive pad 12 may include, but is not limited to, for example metal such as copper (Cu) or the like. In some embodiments, the first conductive pad 12 may include UBM (under bump metallurgy). In some embodiments, passivation layer(s) may be disposed on the first substrate 10, and the passivation layer(s) my at least partially expose the first conductive pad 12.

The second substrate 20 may include a package substrate such as a circuit board. By way of example, the second substrate 20 may include one or more dielectric layers, one or more circuit layers, and one or more second conductive pads 22 disposed on the dielectric layer(s). Materials of the dielectric layer, the circuit layer and the second conductive pad 22 of the second substrate 20 may be similar to that of the dielectric layer, the circuit layer and the first conductive pad 12 of the first substrate 10. In some embodiments, the second conductive pad 22 may include UBM (under bump metallurgy). In some embodiments, passivation layer(s) may be disposed on the second substrate 20, and the passivation layer(s) my at least partially expose the second conductive pad 22.

The semiconductor device package 1 may further include one or more first electronic components 16 disposed on the first substrate 10, and one or more second electronic components 26 disposed on the second substrate 20. The first electronic components 16 may be disposed on the first surface 101 and/or a third surface 102 opposite to the first surface 101 of the first substrate 10. The second electronic components 26 may be disposed on the second surface 201 and/or a fourth surface 202 opposite to the second surface 201 of the second substrate 20. In some embodiments, the first electronic components 16 may include active electronic components 16A such as system on chip (SOC), memory component or the like, and/or passive electronic components 16B such as resistor, capacitor or inductor. The first electronic components 16 can be in electrical communication with each other through the first substrate 10. In some embodiments, the second electronic components 26 may include active electronic components 26A such as system on chip (SOC), memory component or the like, and/or passive electronic components 26B such as resistor, capacitor or inductor. The second electronic components 26 can be in electrical communication with each other through the second substrate 20. The first electronic components 16 and the second electronic components 26 can be in electrical communication with each other through the first substrate 10, the conductive structures 30 and the second substrate 20. The semiconductor device package 1 may further include an encapsulation layer 40 disposed between the first surface 101 and the second surface 201, and encapsulating the conductive structure 30, the first electronic components 16 disposed on the first surface 101 of the first substrate 10 and the second electronic components 26 disposed on the second surface 201 of the second substrate 20.

In some embodiments, the semiconductor device package 1 may further include another encapsulation layer 42 disposed on the third surface 102 and encapsulating the first electronic components 16 disposed on the third surface 102 of the first substrate 10, and/or another encapsulation layer 44 disposed on the fourth surface 202 and encapsulating the second electronic components 26 disposed on the fourth surface 202 of the second substrate 20. The material(s) of the first encapsulation layer 40, the second encapsulation layer 42 and the third encapsulation layer 44 may include organic molding compound such as epoxy resin or the like. The material(s) of the first encapsulation layer 40, the second encapsulation layer 42 and the third encapsulation layer 44 may be the same or different. In some embodiments, fillers such as silicon oxide fillers may be individually added in the first encapsulation layer 40, the second encapsulation layer 42 and the third encapsulation layer 44.

In some embodiments, the semiconductor device package 1 may further include electrical conductors 18 such as solder balls disposed on the third surface 102 of the first substrate 10 and configured to electrically connect the first substrate 10 to another electronic device such as a printed circuit board (PCB).

As shown in FIG. 1A, the conductive structure 30 may include an I-shaped structure extended along a first direction D1 substantially perpendicular to the first surface 101 of the first substrate 10 or the second surface 201 of the second substrate 20. The conductive structure 30 is disposed between the first substrate 10 and the second substrate 20, and electrically connected to the first substrate 10 and the second substrate 20. The conductive structure 30 may include a first wetting portion 31 proximal to the first substrate 10, a second wetting portion 32 proximal to the second substrate 20, and a non-wetting portion 33 disposed between the first wetting portion 31 and the second wetting portion 32. The conductive structure 30 may be a pre-formed structure, which is formed before bonding to the first substrate 10 and the second substrate 20. For example, the first wetting portion 31, the second wetting portion 32, and the non-wetting portion 33 may be formed before the conductive structure 30 is bonded to both the first substrate 10 and the second substrate 20.

The semiconductor device package 1 may further include a first solder 14 and a second solder 24. The first solder 14 covers the first wetting portion 31 and connects the conductive structure 30 to the first substrate 10. The second solder 24 covers the second wetting portion 32 and connects the conductive structure 30 to the second substrate 20.

The surface properties or materials of the first wetting portion 31, the second wetting portion 32 and the non-wetting portion 31 and the material(s) of the first solder 14 and the second solder 24 are selected such that the first solder 14 tends to wet the first wetting portion 31 rather than the non-wetting portion 33 and the second solder 24 tends to wet the second wetting portion 32 rather than the non-wetting portion 33. Specifically, the first solder 14 tends to cling or adhere to the surface of the first wetting portion 31, and tends to be shed from the surface of the non-wetting portion 33. Similarly, the second solder 24 tends to cling or adhere to the surface of the second wetting portion 32, and tends to be shed from the surface of the non-wetting portion 33. Accordingly, the first solder 14 and the second solder 24 can be kept adjacent to the first conductive pad 12 and the second conductive pad 22 respectively, and separated from each other. Due to the influence of gravity, pad size deviation or alignment variation, the first solder 14 may flow from the first conductive pad 12 toward the second conductive pad 22, which causes the amount of the first solder 14 increase and the amount of the second solder 24 decrease. In such a case, insufficient amount of the first solder 14 may cause a poor joint between the first solder 14, the conductive structure 30 and the first conductive pad 12, resulting in open-circuitry risk. Excessive amount of the second solder 24 may overflow to adjacent joint, resulting in short-circuitry risk. Similar problem will occur when the second solder 24 flows from the second conductive pad 22 toward the first conductive pad 12. The non-wetting portion 33 can help to keep the first solder 14 adjacent to the first conductive pad 12, and keep the second solder 24 adjacent to the second conductive pad 22. Therefore, the amount of the first solder 14 and the amount of the second solder 24 can be accurately controlled, and open-circuitry and short-circuitry risks can be reduced.

The material of the first solder 14 and the second solder 24 may include for example, but is not limited to, tin (Sn), lead (Pb), silver (Ag), copper (Cu) or an alloy thereof. In some embodiments, the material of the first solder 14 and the second solder 24 may include the same material. In some other embodiments, the first solder 14 and the second solder 24 may include different materials, and a melting point of the first solder 14 may be different from that of the second solder 24.

As shown in FIG. 1A, the conductive structure 30 may include a wetting material 30A, and a non-wetting material 30B. The wetting material 30A may be a bulk material of the conductive structure 30, and the non-wetting portion 303 may include a liner of a non-wetting material 30B partially formed on the bulk material. For example, the non-wetting material 30B may be a liner covering a middle portion of the wetting material 30A and exposing a bottom portion and an upper portion of the wetting material 30A. The exposed bottom portion and the exposed upper portion of the wetting material are configured as the first wetting portion 31 and the second wetting portion 32, respectively. The middle portion of the wetting material 30A covered with the non-wetting material 30B is configured as the non-wetting portion 33. The wetting material 30A and the non-wetting material 30B are such selected that the first solder 14 and the second solder 24 tend to cling or adhere to the surface of the wetting material 30A, but tend to be shed from the surface of the non-wetting material 30B. The wetting material 30A may include, but is not limited to, a conductive material such as metal or an alloy, and the non-wetting material 30B may include a non-conductive material such as an oxide compound of the metal or the alloy. By way of example, the wetting material 30A may include copper (Cu), iron (Fe), nickel (Ni), gold (Au), silver (Ag) or the like, and the non-wetting material 30B may include an oxide compound of copper (Cu), iron (Fe), nickel (Ni), gold (Au) or silver (Ag). The length of the non-wetting portion 33 can be configured to enhance the effect of separating the first solder 14 and the second solder 24. For example, the length of the non-wetting portion 33 can be, but is not limited to be, ranged from about 10% to about 30% of the length of the conductive structure 30. The length of the first wetting portion 31 and the length of the second wetting portion 32 may be the same or different.

Figure 1B:
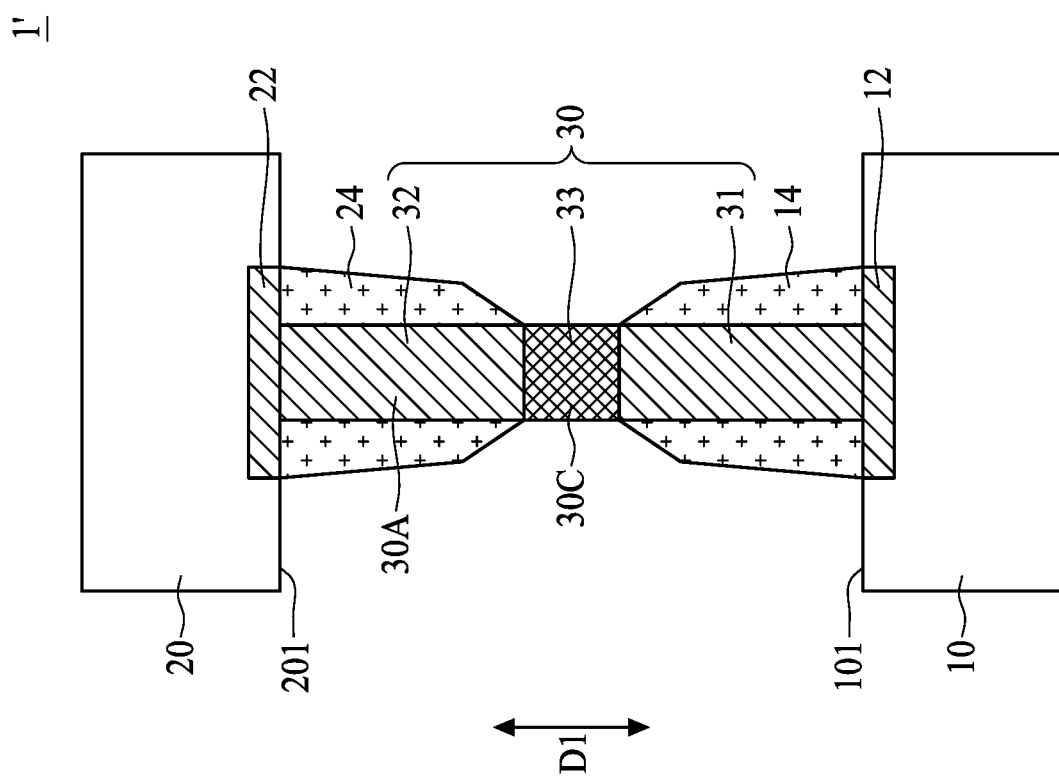
FIG. 1B is a side view of a semiconductor device package in accordance with some embodiments of the present disclosure.

FIG. 1B is a side view of a semiconductor device package 1' in accordance with some embodiments of the present disclosure. As shown in FIG. 1B, the material of the non-wetting portion 33 may include a non-wetting material 30C, and a material of the first wetting portion 31 and a material of the second wetting portion 32 may include a wetting material 30A. In some embodiments, two ends of the non-wetting material 30C are connected to the wetting material 30A. The wetting material 30A and the non-wetting material 30C are such selected that the first solder 14 and the second solder 24 tend to cling or adhere to the surface of the wetting material 30A, but tend to be shed from the surface of the non-wetting material 30C. By way of examples, the wetting material 30A may include metal such as copper (Cu), iron (Fe) or an alloy thereof, and the non-wetting material 30C may include stainless steel (SS), chromium (Cr) or the like.

Figure 2B:
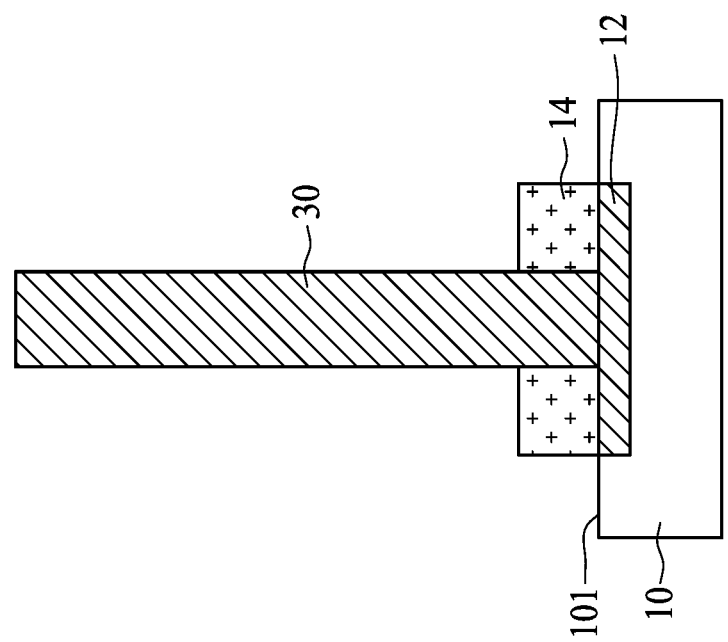

FIG. 2A, FIG. 2B, FIG. 2C, FIG. 2D, FIG. 2E, FIG. 2F and FIG. 2G illustrate operations for manufacturing a semiconductor device package in accordance with some embodiments of the present disclosure. Referring to FIG. 2A, a first substrate 10 with a first conductive pad 12 and a first solder 14 formed thereon is received. In some embodiments, the first solder 14 is in a form of paste. A conductive structure 30 is received. For example, the conductive structure 30 is formed in advance. In some embodiments, the material of the conductive structure 30 includes a wetting material such as copper (Cu). The conductive structure 30 can be cleaned in advance to remove flux on the surface of the conductive structure 30. During the clean operation, the metal oxide such as copper oxide is removed to expose the metal such as copper.

Referring to FIG. 2B, the pre-formed conductive structure 30 is bonded to the first substrate 10 with the first solder 14. For example, the conductive structure 30 is picked, partly inserted into the firsts solder 14 and placed on the first conductive pad 12. It is contemplated that the wetting material such as copper is exposed from the surface of the conductive structure 30 when the conductive structure 30 is inserted into the first solder 14 such that the first solder 14 is in contact with the wetting material.

Figure 2C:
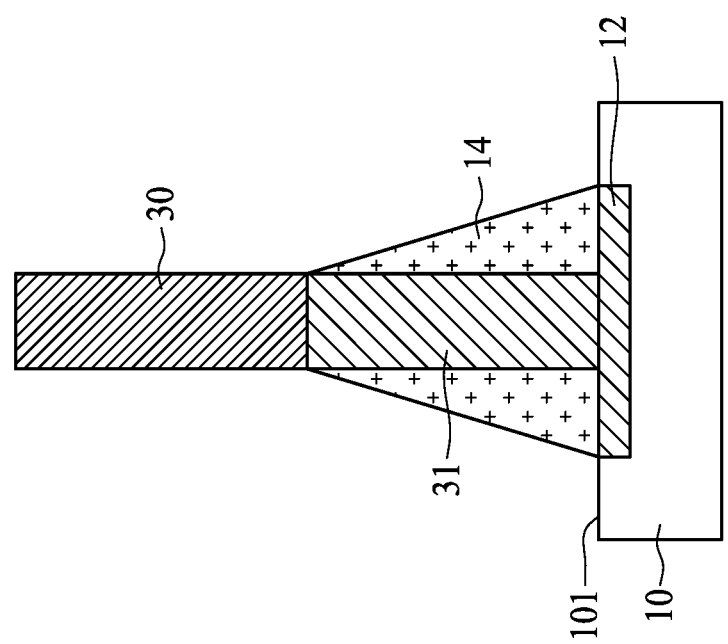

Referring to FIG. 2C, a reflow operation is performed on the first solder 14 by, for example heating the first solder 14 to a temperature higher than its melting point, such that the first solder 14 claims up to a higher position, and covers a portion of the conductive structure 30. The portion of the conductive structure 30 covered with the first solder 14 after reflow forms a first wetting portion 31. In some embodiments, oxide compound of the wetting material may be formed on the surface of the conductive structure 30 exposed from the first solder 14. In some embodiments, the oxide compound of the wetting material may be formed by exposing the conductive structure 30 in an oxygen-containing environment such as an atmospheric environment.

Figure 2D:
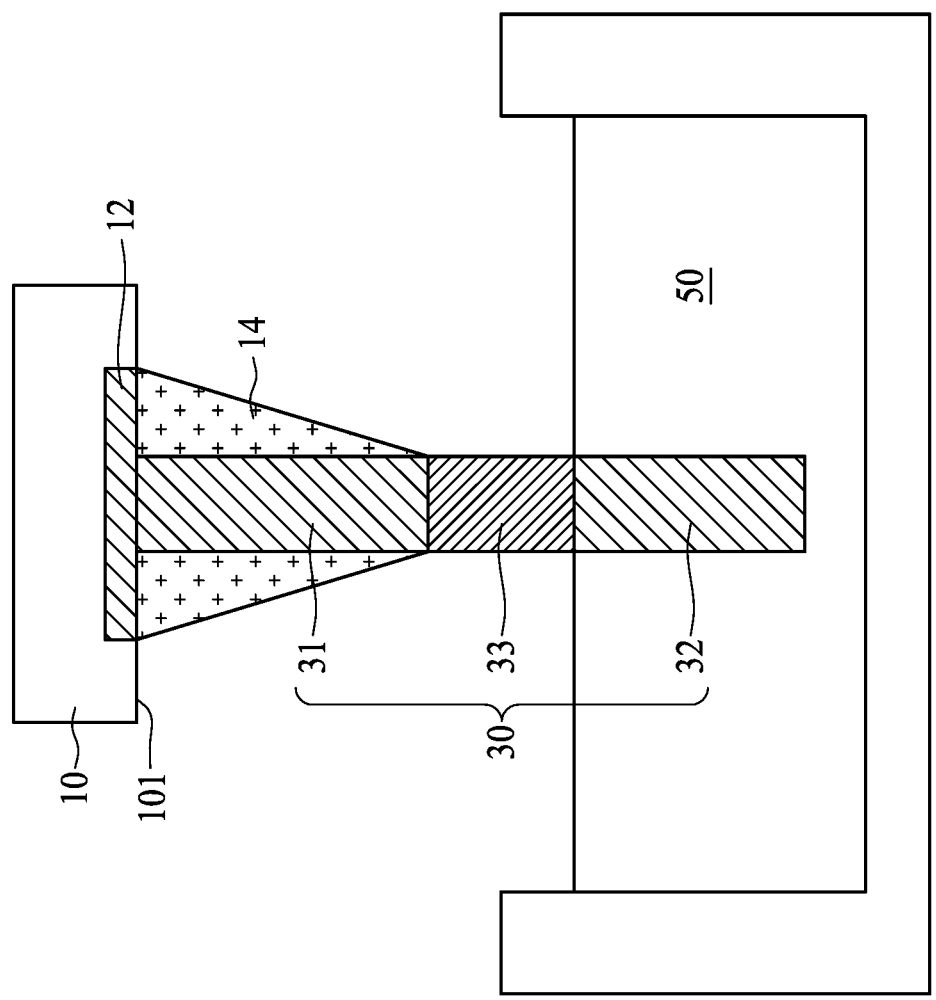

A surface treatment may be performed on the conductive structure 30 exposed from the first solder 14 to form a second wetting portion and a non-wetting portion between the first solder 14 and the first wetting portion 31 as illustrated in FIG. 2D-2G. Referring to FIG. 2D, the surface treatment may include immersing a portion of the conductive structure 30 in a cleaning solution 50 to remove flux and the oxide compound of the wetting material from the portion to form the wetting portion 33, and the oxide compound of the wetting material on another portion, which is not immersed into the cleaning solution, is reserved to form the non-wetting portion.

Figure 2E:
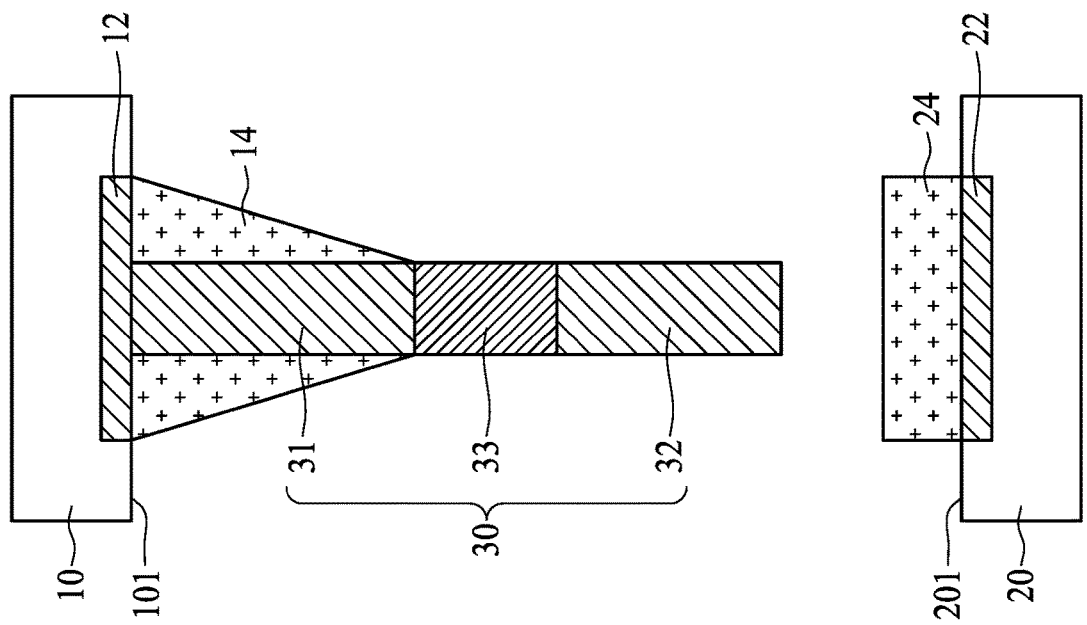
Figure 2F:
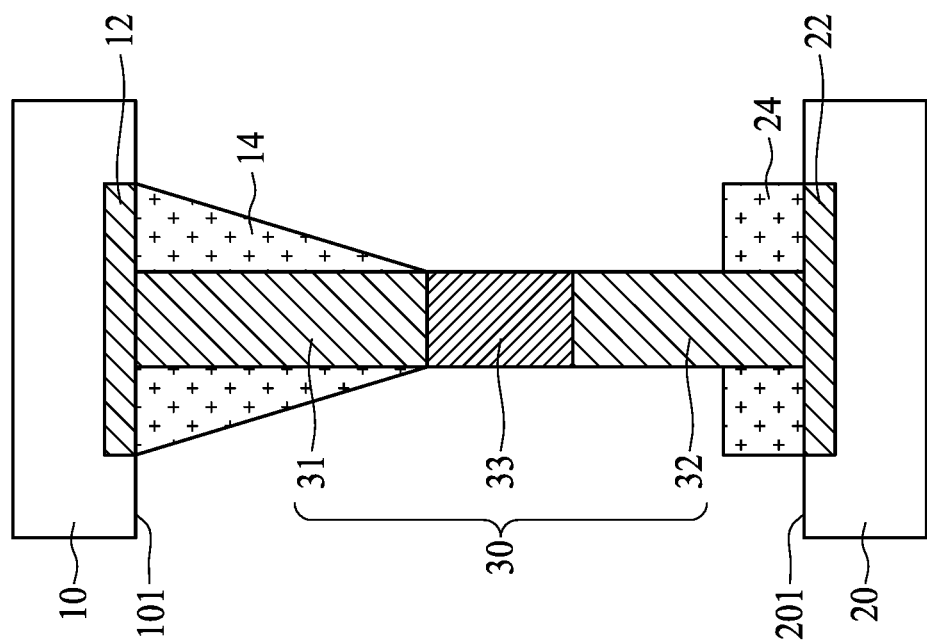

Referring to FIG. 2E, a second substrate 20 with a second conductive pad 22 and a second solder 24 formed thereon is received. In some embodiments, the second solder 24 is in a form of paste. Referring to FIG. 2F, the conductive structure 30 is bonded to the second substrate 20 with the second solder 24. For example, the conductive structure 30 is picked, and the second wetting portion 32 is inserted into the second solder 24. It is contemplated that the wetting material such as copper is exposed from the surface of the second wetting portion 32 when the second wetting portion 32 is inserted into the second solder 24 such that the second solder 24 is in contact with the wetting material.

Figure 2G:
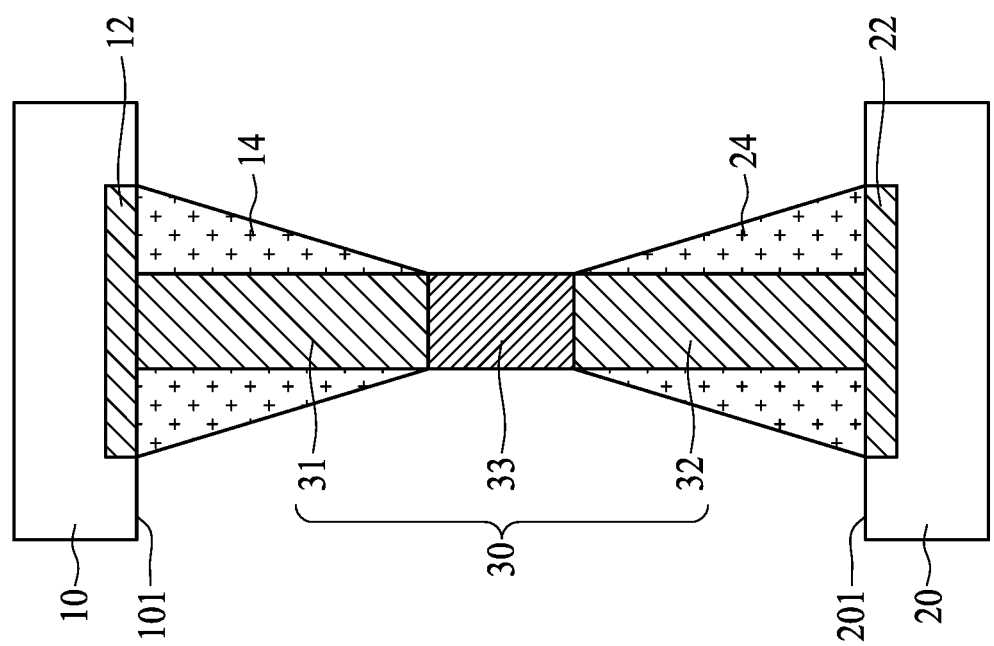

Referring to FIG. 2G, a reflow operation is performed on the second solder 24 by, for example heating the second solder 24 to a temperature higher than its melting point, such that the second solder 24 climbs up the second wetting portion 32. In some embodiments, the materials of the first solder 14 and the second solder 24 are selected such that the melting point of the first solder 14 is higher than the melting point of the second solder 24. In such a case, the first solder 14 does not melt during the reflow operation on the second solder 24, and the position of the conductive structure 30 can be fixed during the reflow operation. An encapsulation layer 40 may be formed between the first substrate 10 and the second substrate 20 to form the semiconductor device package 1 as illustrated in FIG. 1 and FIG. 1A. In some other embodiments, the first wetting portion 31, the second wetting portion 32 and the non-wetting portion 33 can be formed by connecting wetting material and non-wetting material, for example, to form the conductive structure 30 as illustrated in FIG. 1B.

Figure 3:
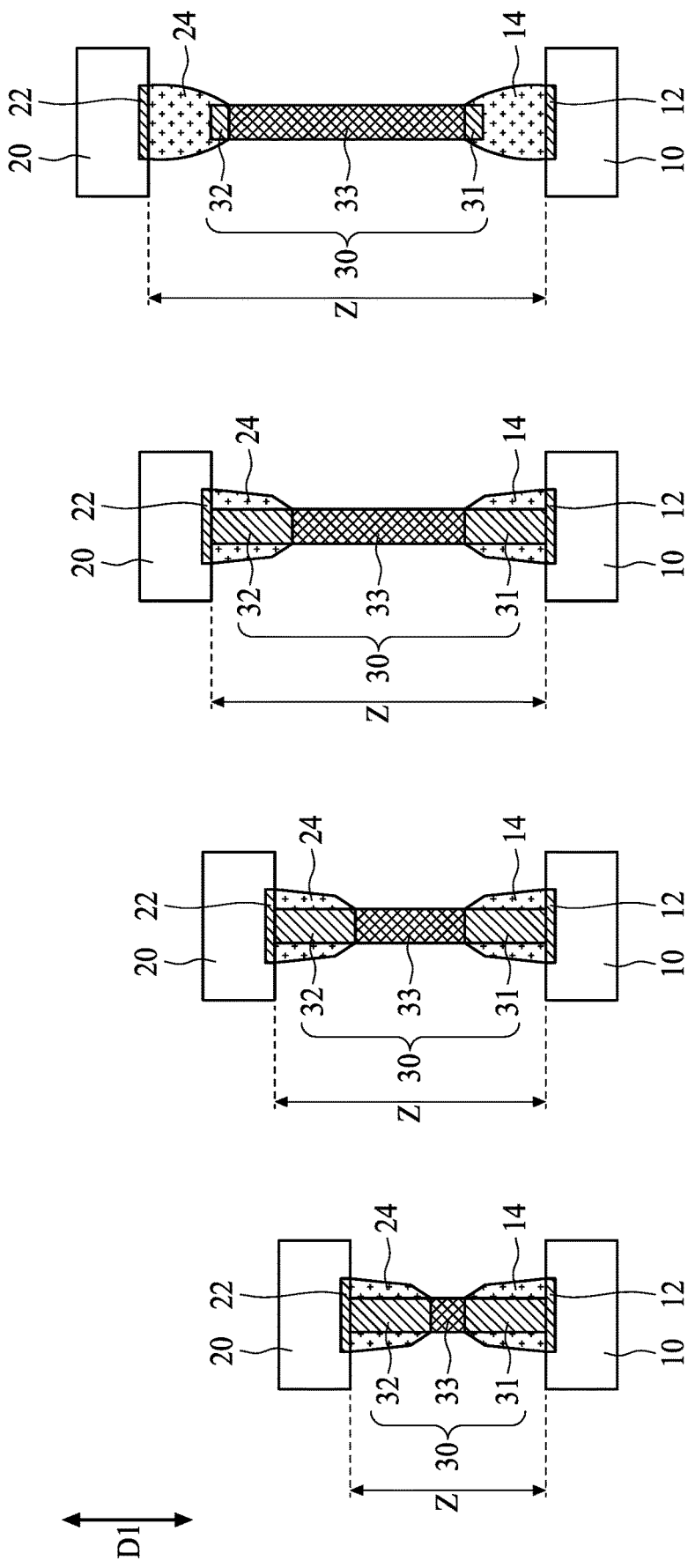
FIG. 3 is a schematic view of conductive structures in accordance with some embodiments of the present disclosure.

FIG. 3 is a schematic view of conductive structures in accordance with some embodiments of the present disclosure. Referring to FIG. 3, in case warpage occurs to the semiconductor device package, the first substrate 10 and the second substrate 20 may have different gaps Z in different locations. For example, the gap Z adjacent to a periphery region may be different from the gap Z adjacent to a central region. The first solder 14 forms a joint between the conductive structure 30 and the first substrate 10, and the second solder 24 forms a joint between the conductive structure 30 and the second substrate 20. When the gap Z is smaller, the conductive structure 30 may be fixed by the first solder 14 and the second solder 24, and in contact with and electrically connected to the first substrate 10 and/or the second substrate 20. When the gap Z is larger, the conductive structure 30 may be fixed by the first solder 14 and the second solder 24, and electrically connected to the first substrate 10 and the second substrate 20 through the first solder 14 and the second solder 24. The first solder 14 and the second solder 24 allow the conductive structure 30 to slide along the first direction D1. The non-wetting portion 32 can keep the first solder 14 and the second solder 24 apart, such that the electrical connection between the first substrate 10 and the second substrate 20 can be ensured. The conductive structure 30 in associations with the first solder 14 and the second solder 24 have higher tolerance than the solder alone to warpage and gap deviation of the semiconductor device package. In some embodiments, the conductive structure 30 may be in contact with the first conductive pad 12 and/or the second conductive pad 22, for example when the gap Z is smaller. In some embodiments, the conductive structure 30 may be apart from the first conductive pad 12 and/or the second conductive pad 22, for example when the gap Z is larger.

The semiconductor device packages and manufacturing methods of the present disclosure are not limited to the above-described embodiments, and may be implemented according to other embodiments. To streamline the description and for the convenience of comparison between various embodiments of the present disclosure, similar components the following embodiments are marked with same numerals, and may not be redundantly described.

Figure 4:
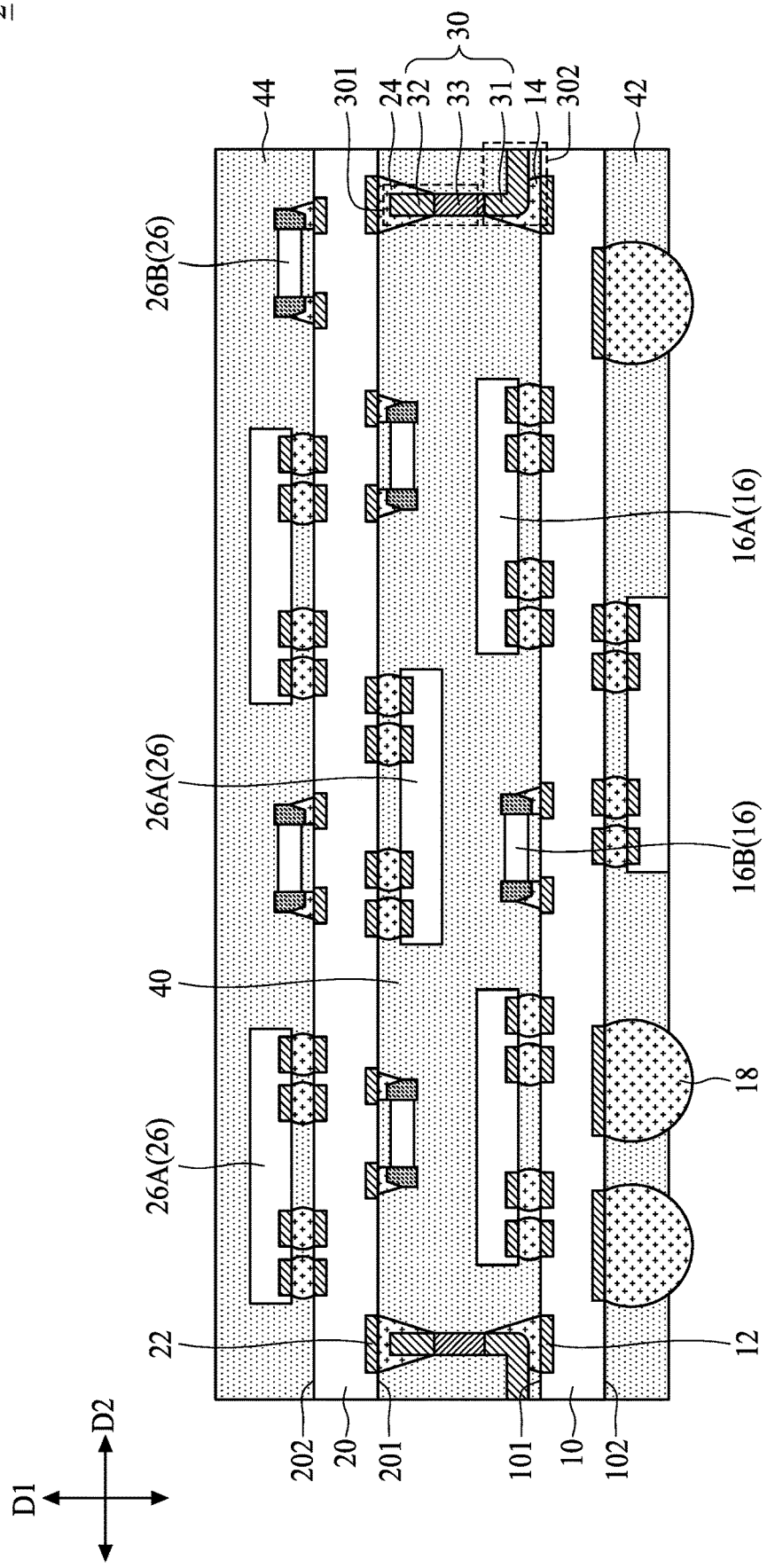
FIG. 4 is a side view of a semiconductor device package in accordance with some embodiments of the present disclosure.
Figure 4A:
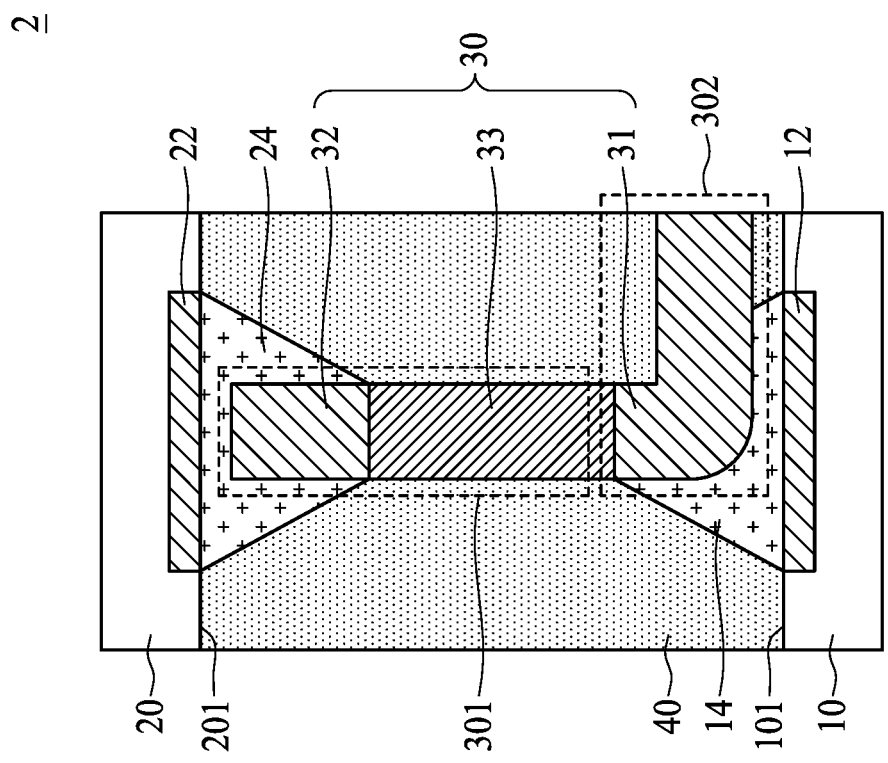
FIG. 4A is an enlarged side view of a semiconductor device package of FIG. 4.
Figure 4A:
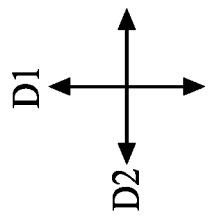

FIG. 4 is a side view of a semiconductor device package 2 in accordance with some embodiments of the present disclosure, and FIG. 4A is an enlarged side view of a semiconductor device package 2 of FIG. 4. In contrast to the semiconductor device package 1 of FIG. 1 and FIG. 1A, the conductive structure 30 of the semiconductor device package 2 includes an L-shaped structure. The conductive structure 30 includes a first section 301 extended along a first direction D1 substantially perpendicular to the first surface 101, and a second section 302 extended along a second direction D2 substantially parallel to the first surface 101. An end of the second section 302 is connected to an end of the first section 301. In some embodiments, the second section 302 may be configured as the first wetting portion 31, a portion of the first section 301 adjacent to the second substrate 20 may be configured as the second wetting portion 32, and the other portion of the first section 301 connected to the second section 302 may be configured as the non-wetting portion 33. The first solder 14 and the second solder 24 cover the first wetting portion 31 and the second wetting portion 32 respectively, and expose the non-wetting portion 33. In some embodiments, the L-shaped structure can be fastened on the first substrate 10 more robustly. In some embodiments, another end of the second section 302 is exposed from an edge of the encapsulation layer 40. The end of the second section 302 may be coplanar with the edge of the encapsulation layer 40.

Figure 5A:
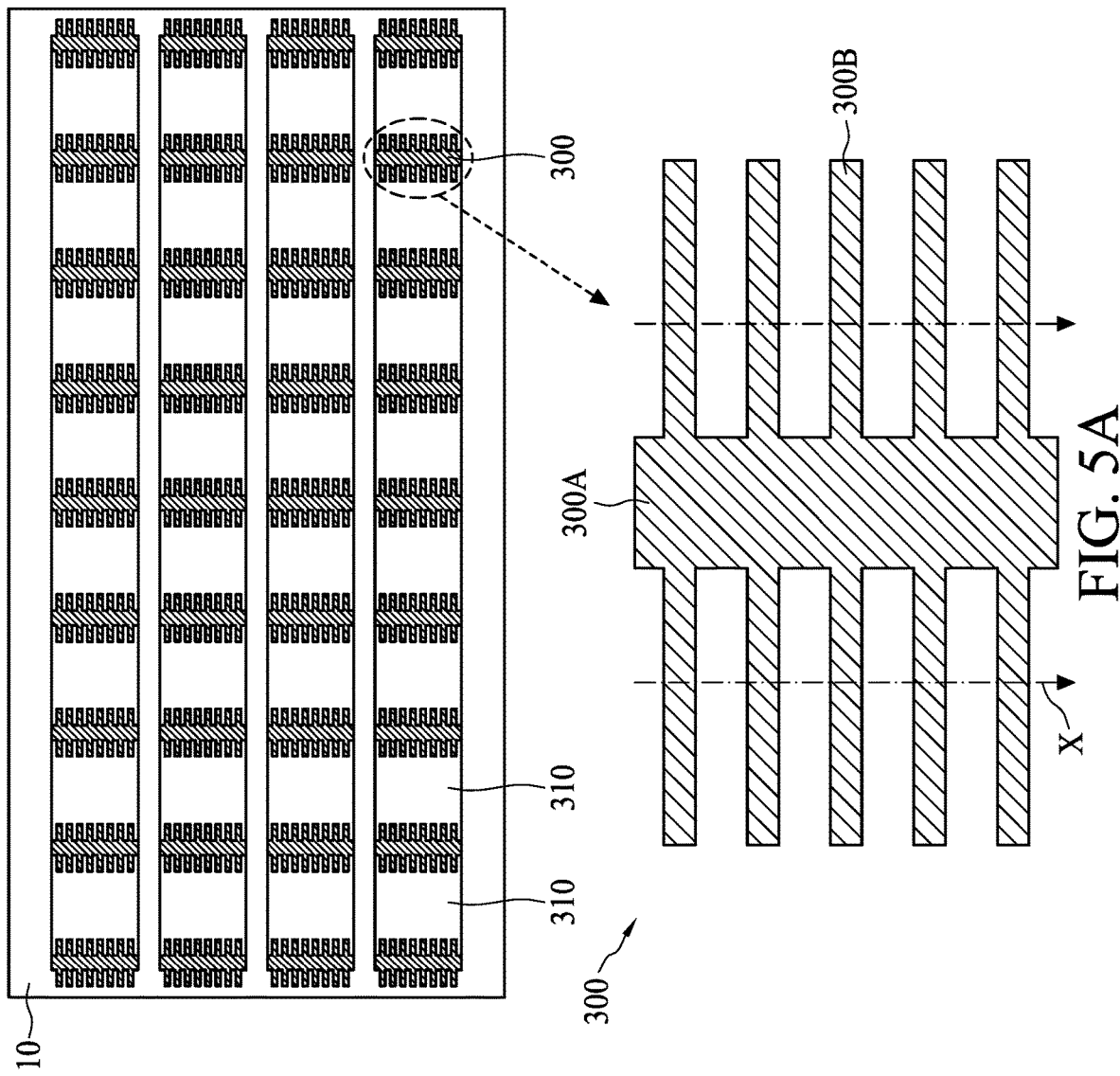
FIG. 5A, FIG. 5B, FIG. 5C, FIG. 5D and FIG. 5E illustrate operations for manufacturing a semiconductor device package in accordance with some embodiments of the present disclosure.
Figure 5B:
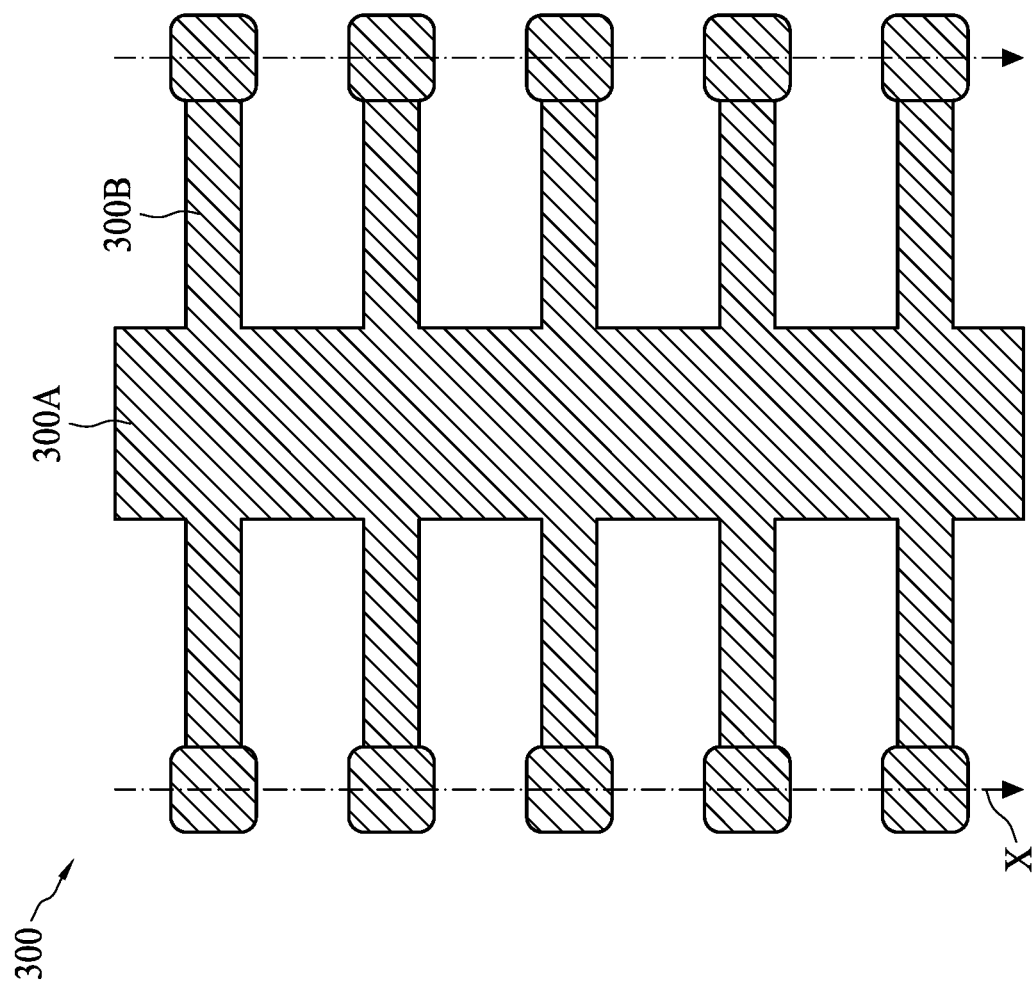
Figure 5C:
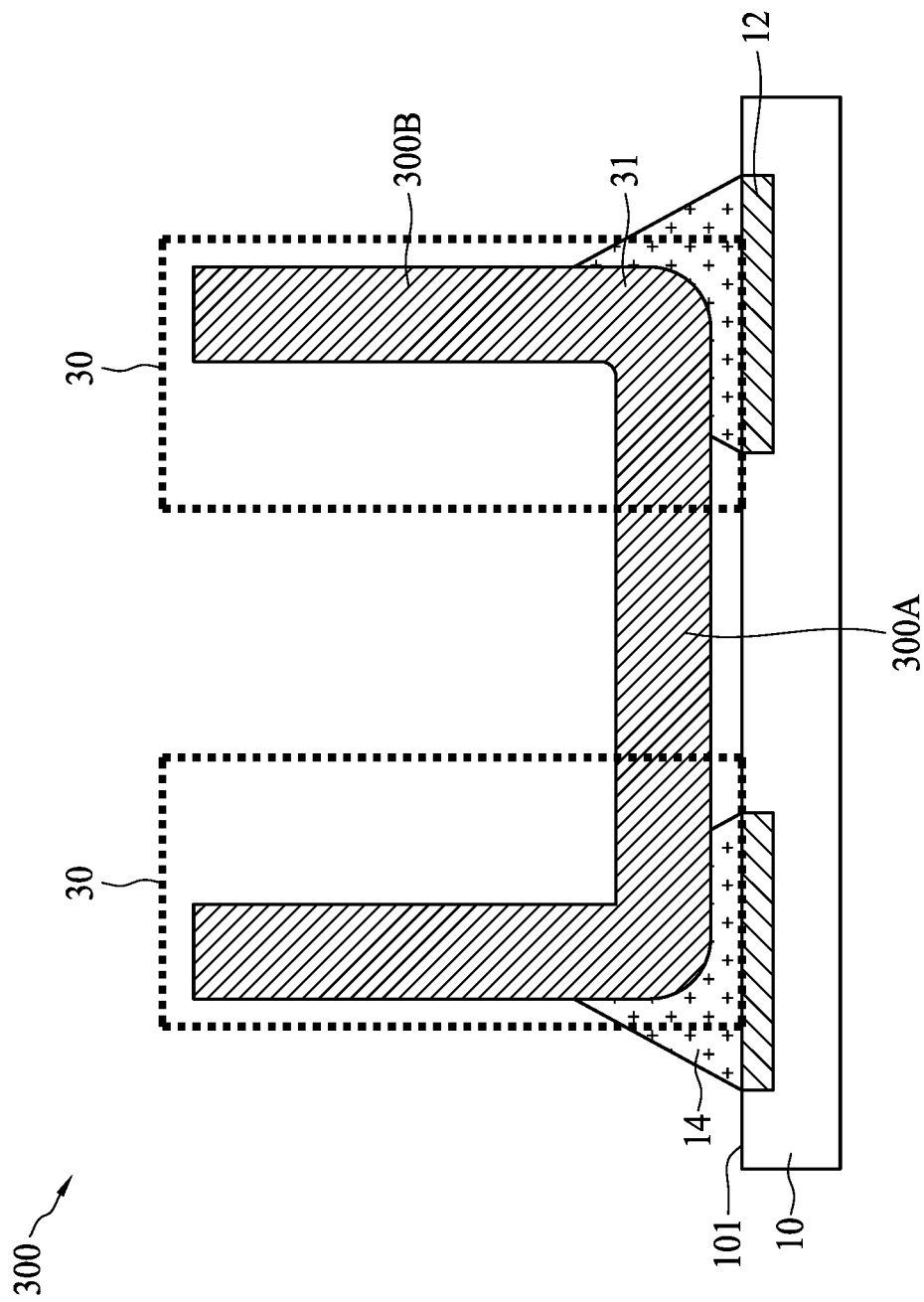

FIG. 5A, FIG. 5B, FIG. 5C, FIG. 5D and FIG. 5E illustrate operations for manufacturing a semiconductor device package in accordance with some embodiments of the present disclosure. Referring to FIG. 5A, a first substrate 10 with the first conductive pads 12 (shown in FIG. 5C) and the first solders 14 (shown in FI. 5C) formed thereon is received. A plurality of conductive frame 300 is formed on the first substrate 10. The conductive frame 300 may have a fishbone pattern including a spine portion 300A and bone portions 300B extended from the spine portion 300A. The spine portion 300A is disposed between adjacent cells 310 configured to form semiconductor device packages, and the bone portions 300B are extended toward the cells 310. In some embodiments, the conductive frame 300 may include a lead frame or the like. The bone portions 300B of the conductive frames 300 are bended upwards about an axis X as illustrated in FIG. 5B and FIG. 5C. The bended conductive frame 300 includes a plurality pairs of conductive structures 30 connected to each other. Cleaning operation and surface treatment may be performed on the conductive structure 30 to form the first wetting portion, the second wetting portion and the non-wetting portion in a manner similar to that described in FIGS. 2A-2G. A reflow operation is performed on the first solders 14 such that the first solders 14 cover the first wetting portions 31, respectively. In some embodiments, the conductive frame 30 can be formed on two opposite sides of the cell 310. In some other embodiments, the conductive frame 300 may be formed on one side, two sides, three sides or all four sides of the cell 310.

Figure 5D:
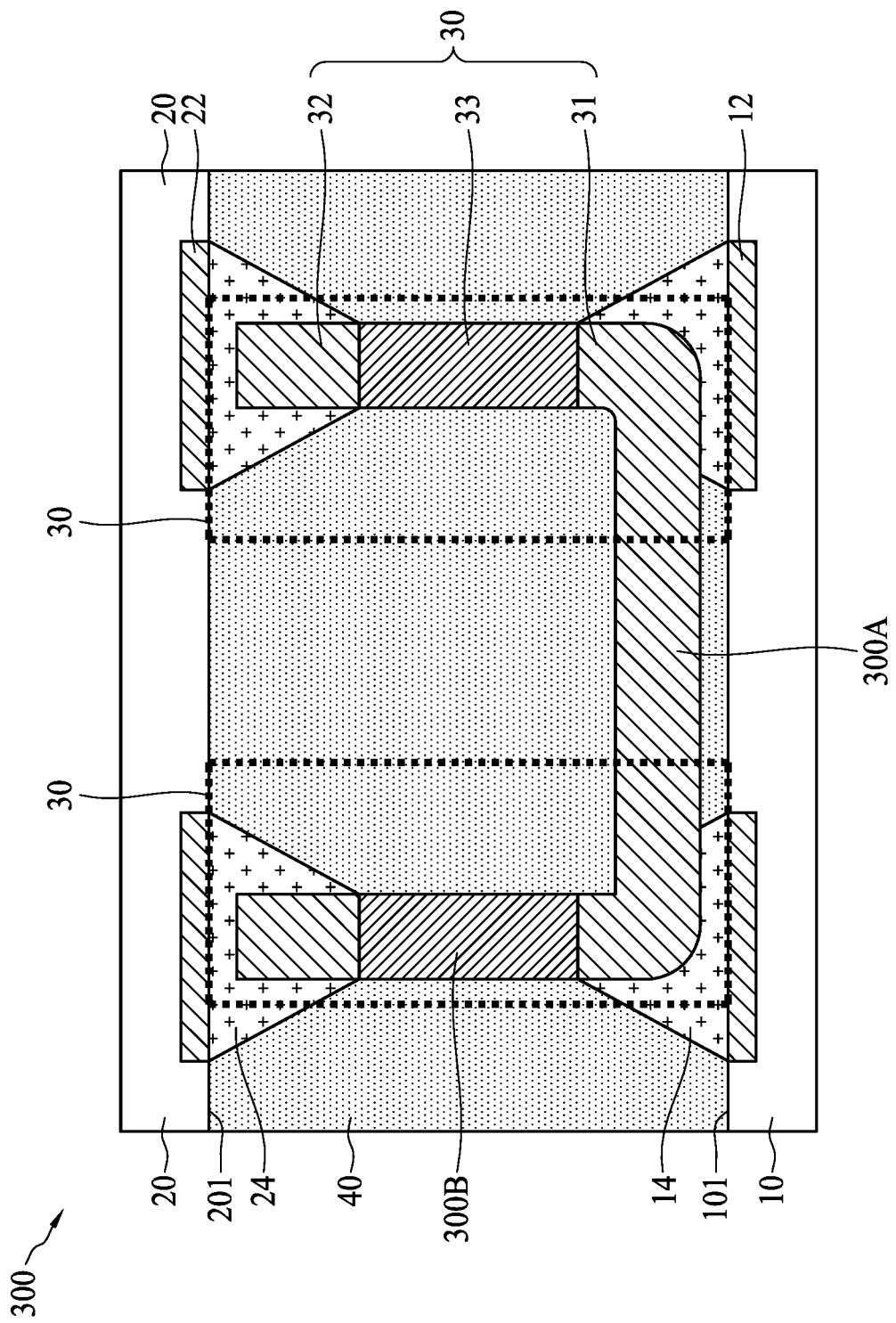

Referring to FIG. 5D, a second substrate 20 with second conductive pads 22 and second solders 24 formed thereon is received. The conductive frame 300 are bonded to the second substrate 20 with the ends of the conductive frame 300 facing the second substrate 20 and being inserted into the second solders 24. A reflow operation is performed on the second solders 24 such that the second solders 24 cover the second wetting portions 32, respectively. Due to the distinctive properties between the first and second wetting portions 31, 32 and the non-wetting portion 33, the first solder 14 and the second solder 24 can be kept apart from each other. An encapsulation layer 40 may be formed between the first substrate 10 and the second substrate 20 to encapsulate the conductive structures 30.

Figure 5E:
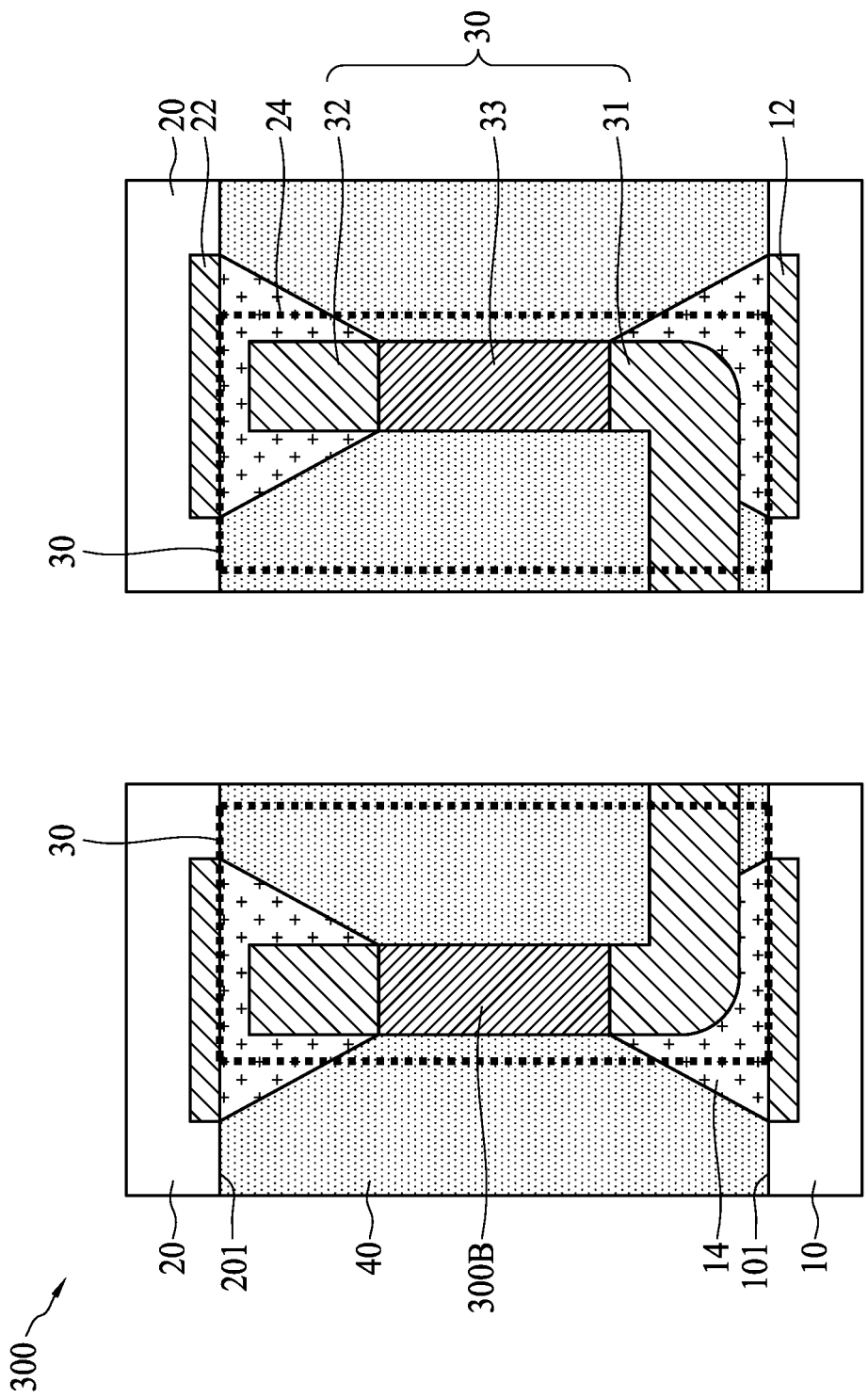

Referring to FIG. 5E, a singulation operation is performed along the spine portion 300A to divide the conductive frame 300 into a plurality of conductive structures 30 as illustrated in FIG. 4 and FIG. 4A. The conductive frame 300 includes a plurality of conductive structures 30, and thus manufacturing costs can be reduced.

Figure 6:
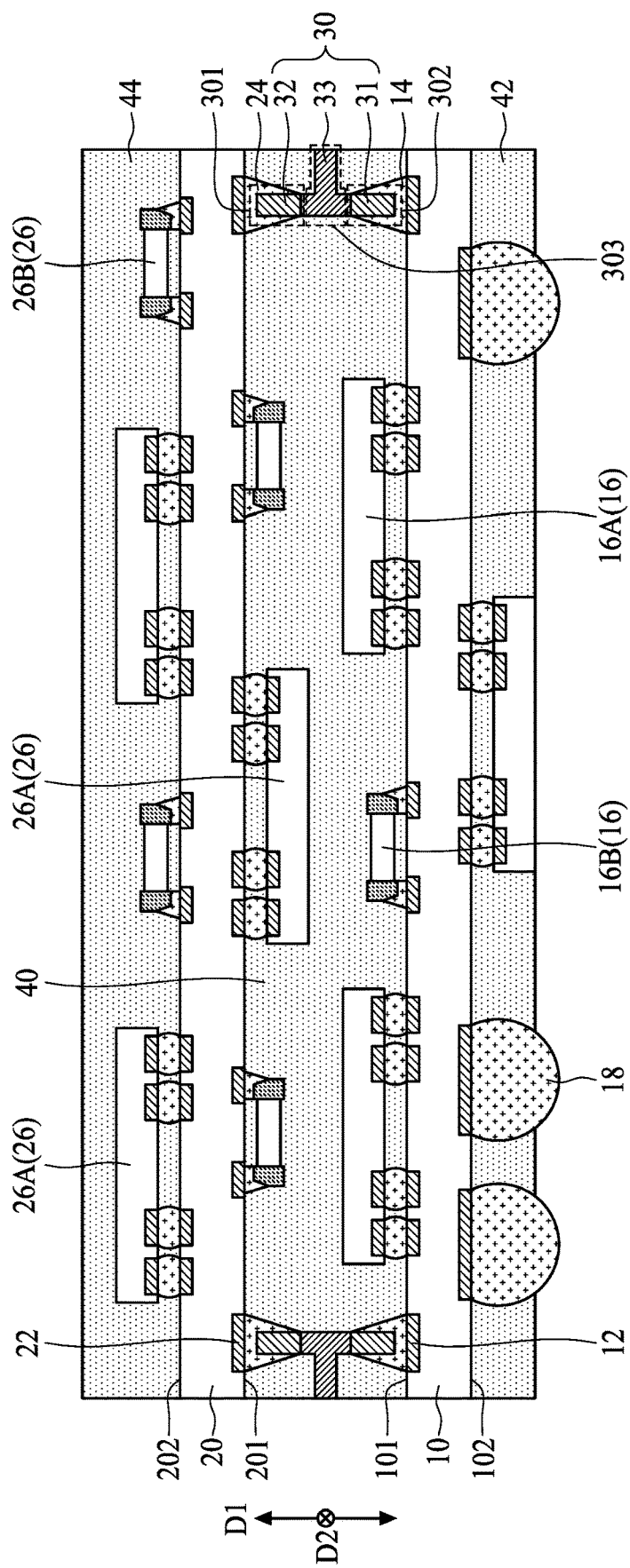
FIG. 6 is a side view of a semiconductor device package in accordance with some embodiments of the present disclosure.
Figure 6A:
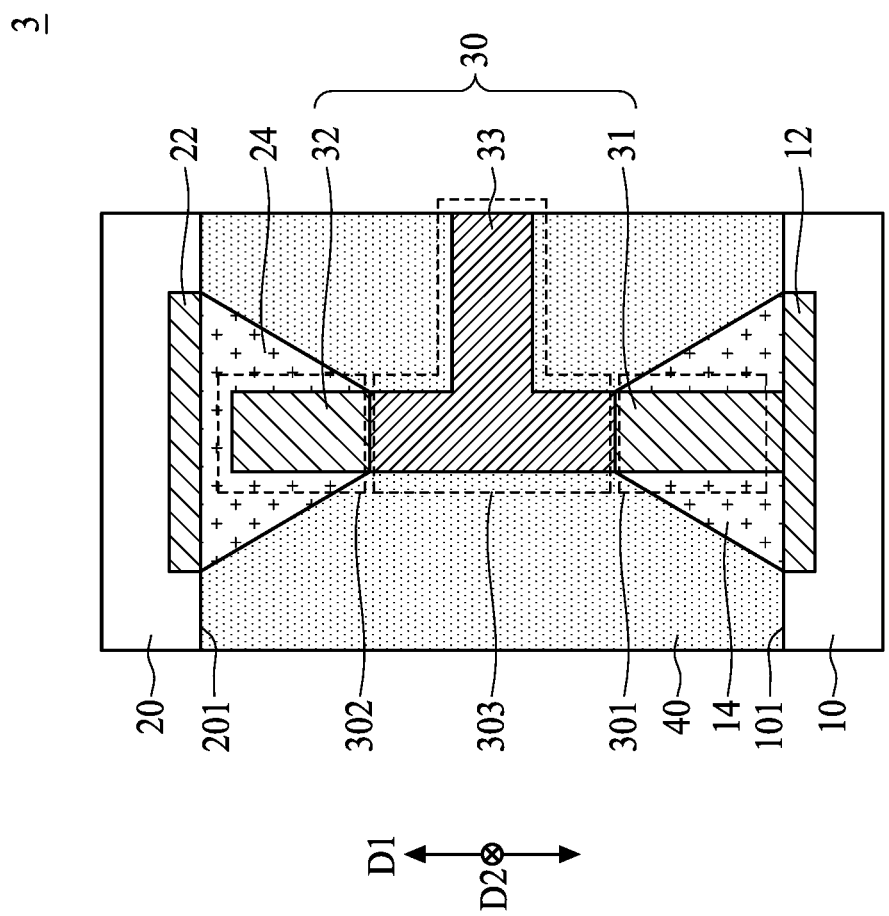
FIG. 6A and FIG. 6B are enlarged side views of a semiconductor device package 3 of FIG. 6 from different directions.
Figure 6B:
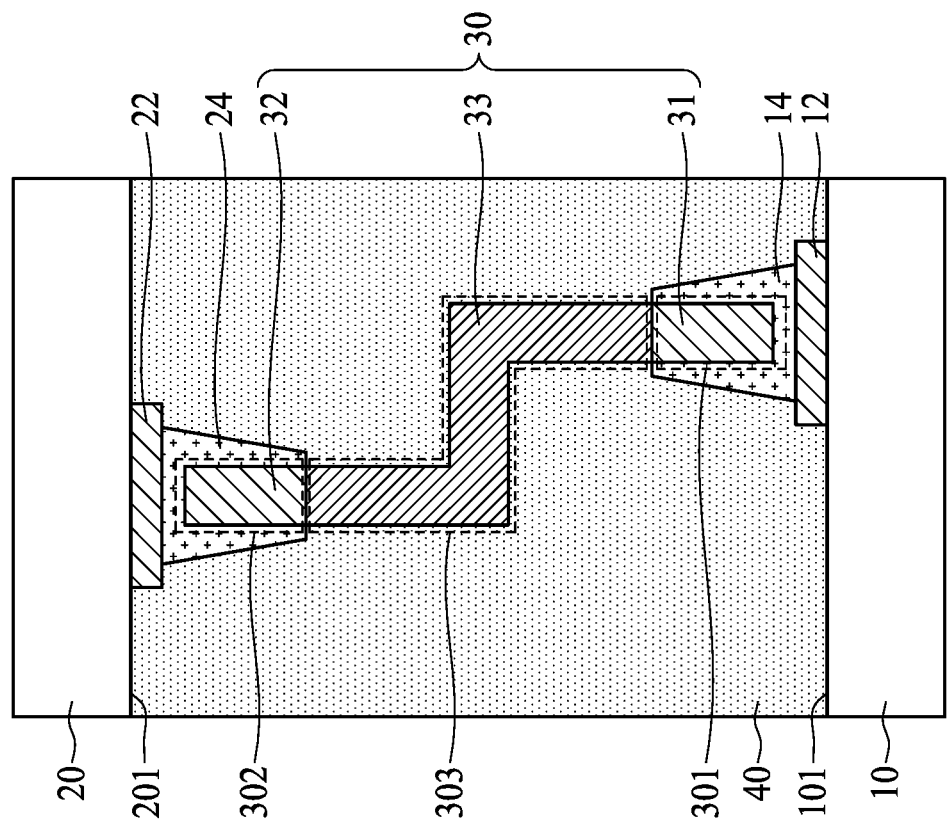

FIG. 6 is a side view of a semiconductor device package 3 in accordance with some embodiments of the present disclosure, and FIG. 6A and FIG. 6B are enlarged side views of a semiconductor device package 3 of FIG. 6 from different directions. In contrast to the semiconductor device package 1 of FIG. 1 and FIG. 1A, the conductive structure 30 of the semiconductor device package 3 includes an N-shaped structure. The conductive structure 30 includes a first section 301 electrically connected to the first substrate 10, a second section 302 electrically connected to the second substrate 20, and a third section 303 separating the first section 301 from the second section 302. The third section 303 includes a step-shaped structure, and may be referred to as a step section 303. By way of example, the step section 303 may include a sideways T shape from one perspective as shown in FIG. 6A, and a N shape from another one perspective as shown in FIG. 6B. In some embodiments, the first section 301 may include a bar-shaped structure, a rod-shaped structure or an I-shaped structure extending along a first direction D1 substantially perpendicular to a first surface 101 of the first substrate 10, and the second section 302 may include a bar-shaped structure, a rod-shaped structure or an I-shaped structure extending extended along the first direction D1. Two ends of the step section 303 are respectively connected to an end of the first section 301 and an end of the second section 302. In some embodiments, the first section 301 may be configured as the first wetting portion 31, and the second section 302 may be configured as the second wetting portion 32. The step section 303 may be configured as the non-wetting portion 33 separating the first section 301 from the second section 302. The first solder 14 and the second solder 24 cover the first section 301 (the first wetting portion 31) and the second section 302 (the second wetting portion 32) respectively, and expose the step section 303 (non-wetting portion 33). In some embodiments, an edge of the step section 303 is exposed from an edge of the encapsulation layer 40. The edge of the step section 303 may be, but is not limited to be, coplanar with the edge of the encapsulation layer 40.

Figure 7A:
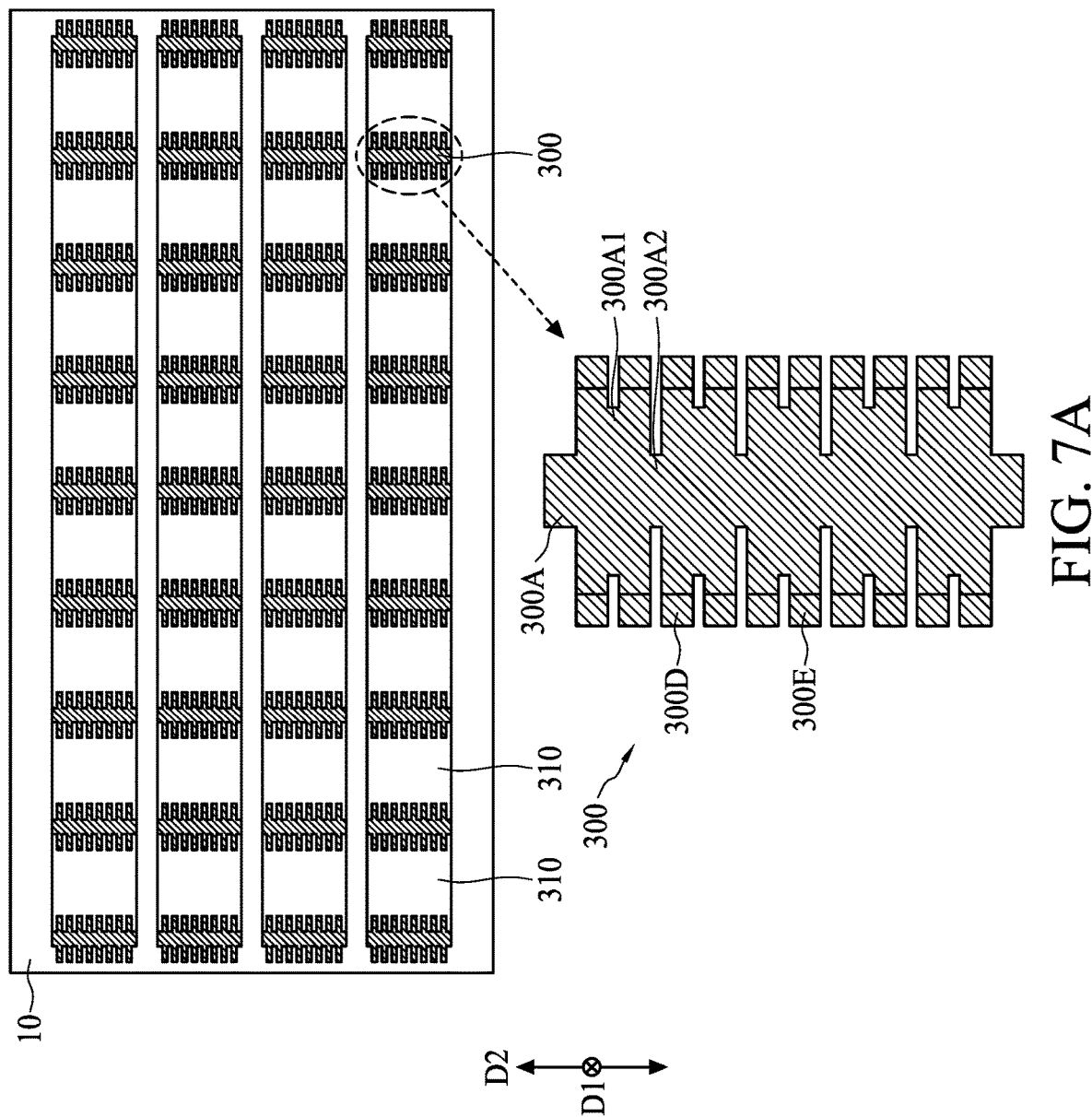
FIG. 7A, FIG. 7B, FIG. 7C, FIG. 7D, FIG. 7E and FIG. 7F illustrate operations for manufacturing a semiconductor device package in accordance with some embodiments of the present disclosure.
Figure 7B:
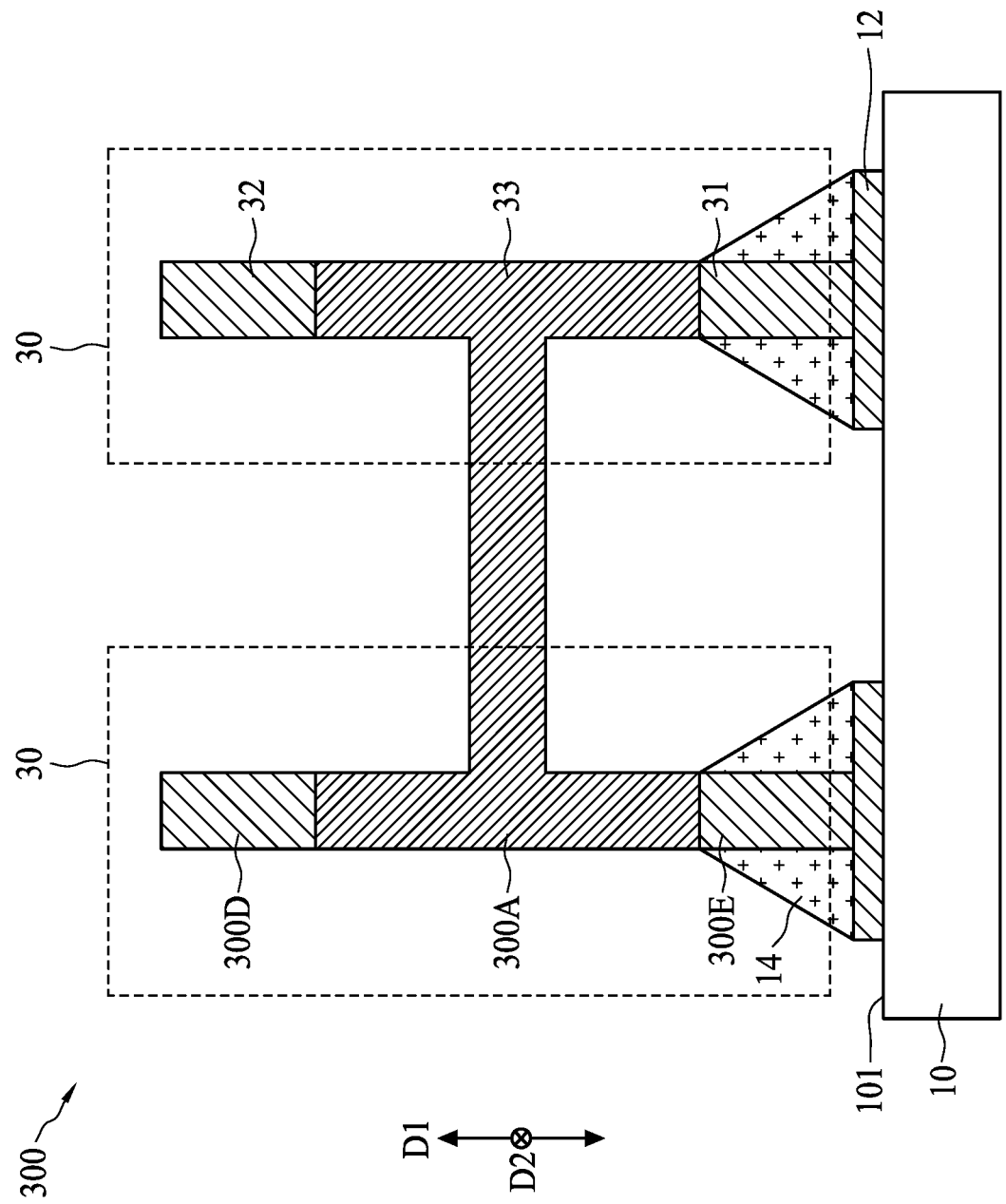
Figure 7C:
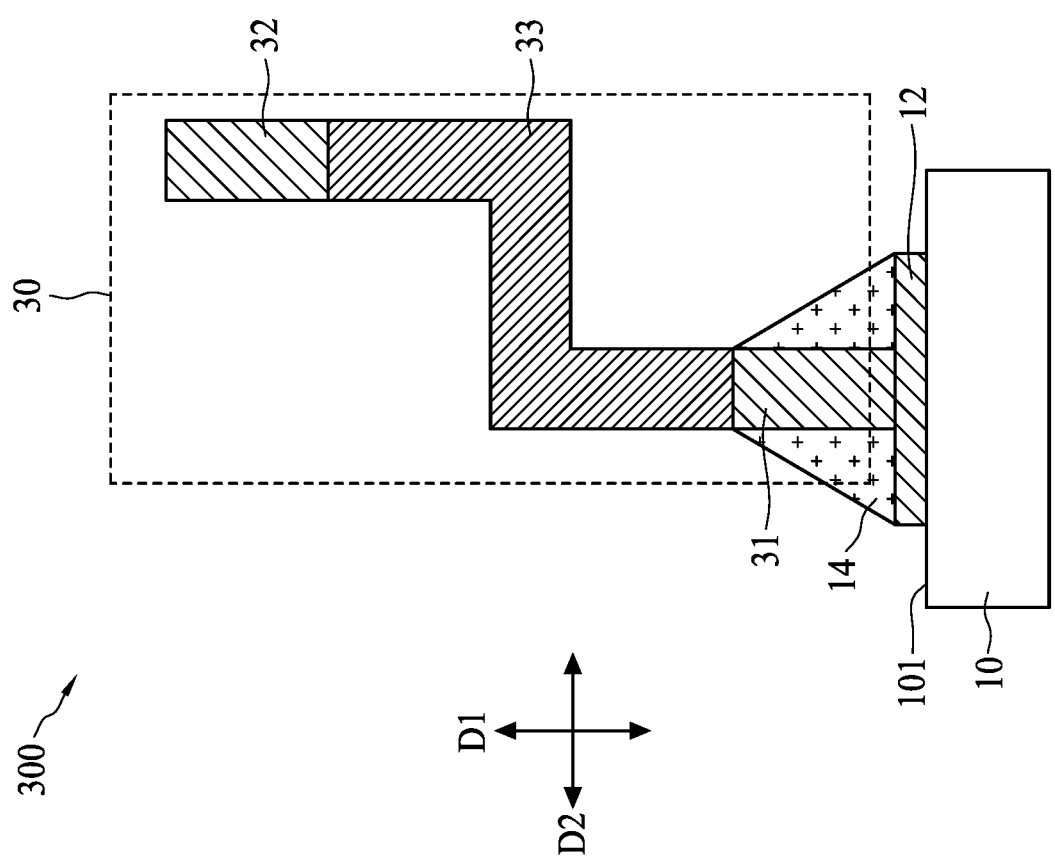

FIG. 7A, FIG. 7B, FIG. 7C, FIG. 7D, FIG. 7E and FIG. 7F illustrate operations for manufacturing a semiconductor device package in accordance with some embodiments of the present disclosure. Referring to FIG. 7A, FIG. 7B and FIG. 7C, a first substrate 10 with the first conductive pads 12 (shown in FIG. 7B and FIG. 7C) and the first solders 14 (shown in FIG. 7B and FIG. 7C) formed thereon is received. A plurality of conductive frame 300 is formed on the first substrate 10. The conductive frame 300 may have a fishbone pattern including a spine portion 300A, first bone portions 300D and second bone portions 300E. The spine portion 300A is disposed between adjacent cells 310 configured to form semiconductor device packages. The spine portion 300A may have first parts 300A1 and second parts 300A2 different in widths and connected alternately. For example, the first part 300A1 is wider than the second part 300A2. The first bone portions 300D are extended from the spine portion 300A and bended upwards. The second bone portions 300E are extended from the spine portion 300A and bended downwards. The first bone portions 300D and the second bone portions 300E are arranged alternately along the second direction D2. In some embodiments, the conductive frame 300 may include a lead frame or the like. The bended conductive frame 300 includes a plurality pairs of conductive structures 30 connected to each other. Cleaning operation and surface treatment may be performed on the conductive structure 30 to form the first wetting portion, the second wetting portion and the non-wetting portion in a manner similar to that described in FIGS. 2A-2G. A reflow operation is performed on the first solders 14 such that the first solders 14 cover the first wetting portions 31, respectively. In some embodiments, the conductive frame 30 can be formed on two opposite sides of the cell 310. In some other embodiments, the conductive frame 300 may be formed on one side, two sides, three sides or all four sides of the cell 310.

Figure 7D:
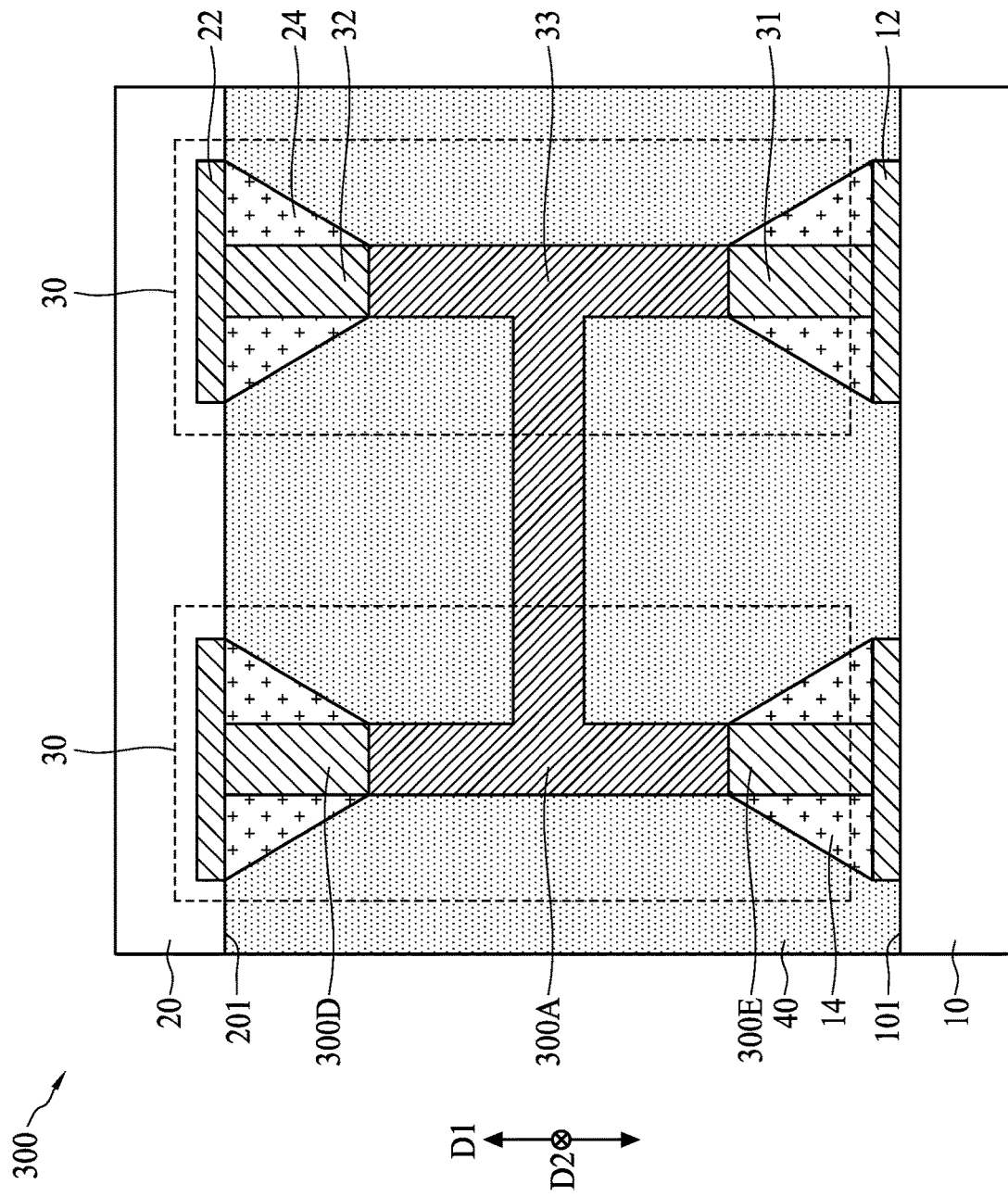
Figure 7E:
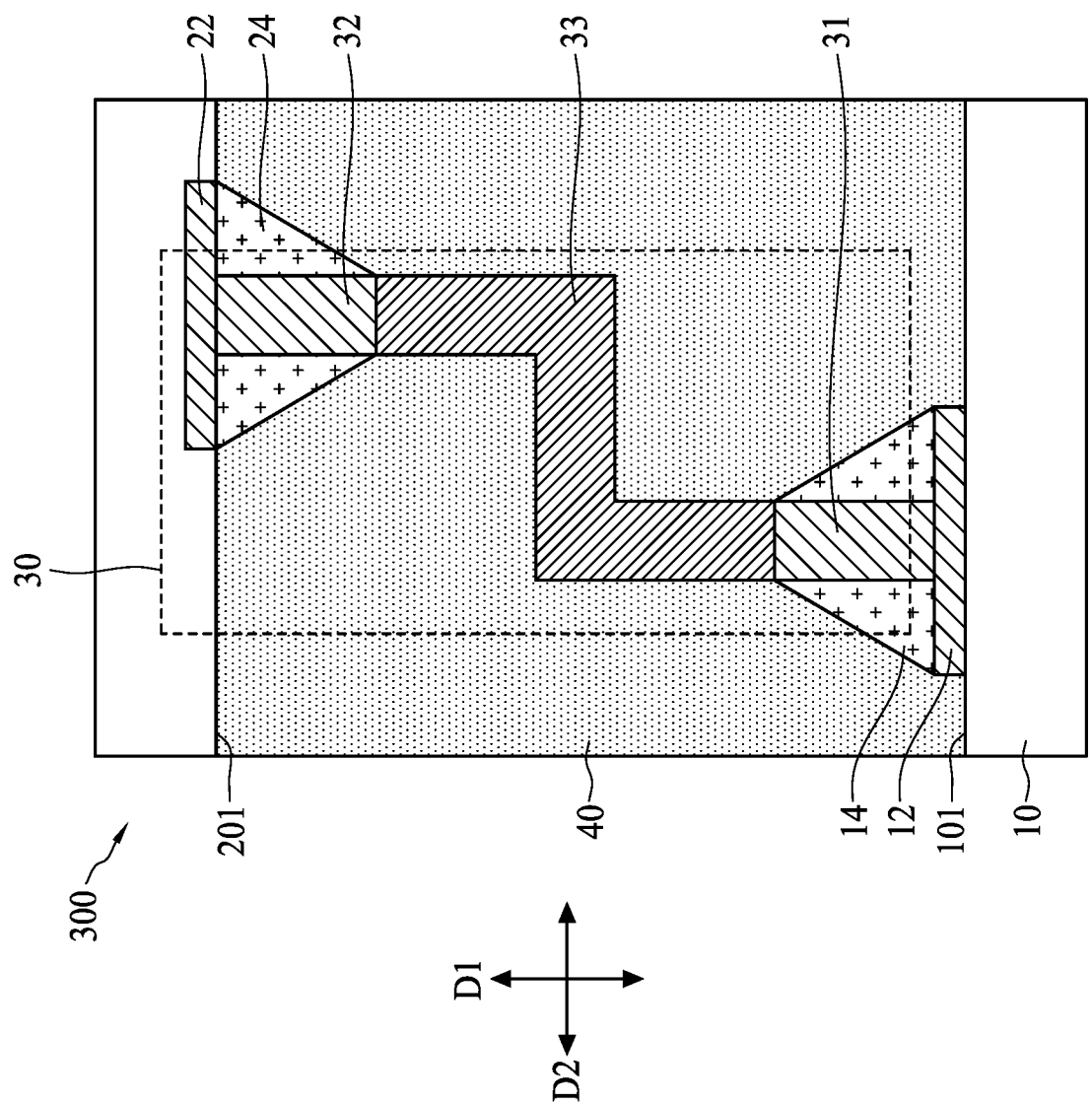

Referring to FIG. 7D and FIG. 7E, a second substrate 20 with second conductive pads 22 and second solders 24 formed thereon is received. The conductive frame 300 are bonded to the second substrate 20 with the ends of the conductive frame 300 facing the second substrate 20 and being inserted into the second solders 24. A reflow operation is performed on the second solders 24 such that the second solders 24 cover the second wetting portions 32, respectively. Due to the distinctive properties between the first and second wetting portions 31, 32 and the non-wetting portion 33, the first solder 14 and the second solder 24 can be kept apart from each other. An encapsulation layer 40 may be formed between the first substrate 10 and the second substrate 20 to encapsulate the conductive structures 30.

Figure 7F:
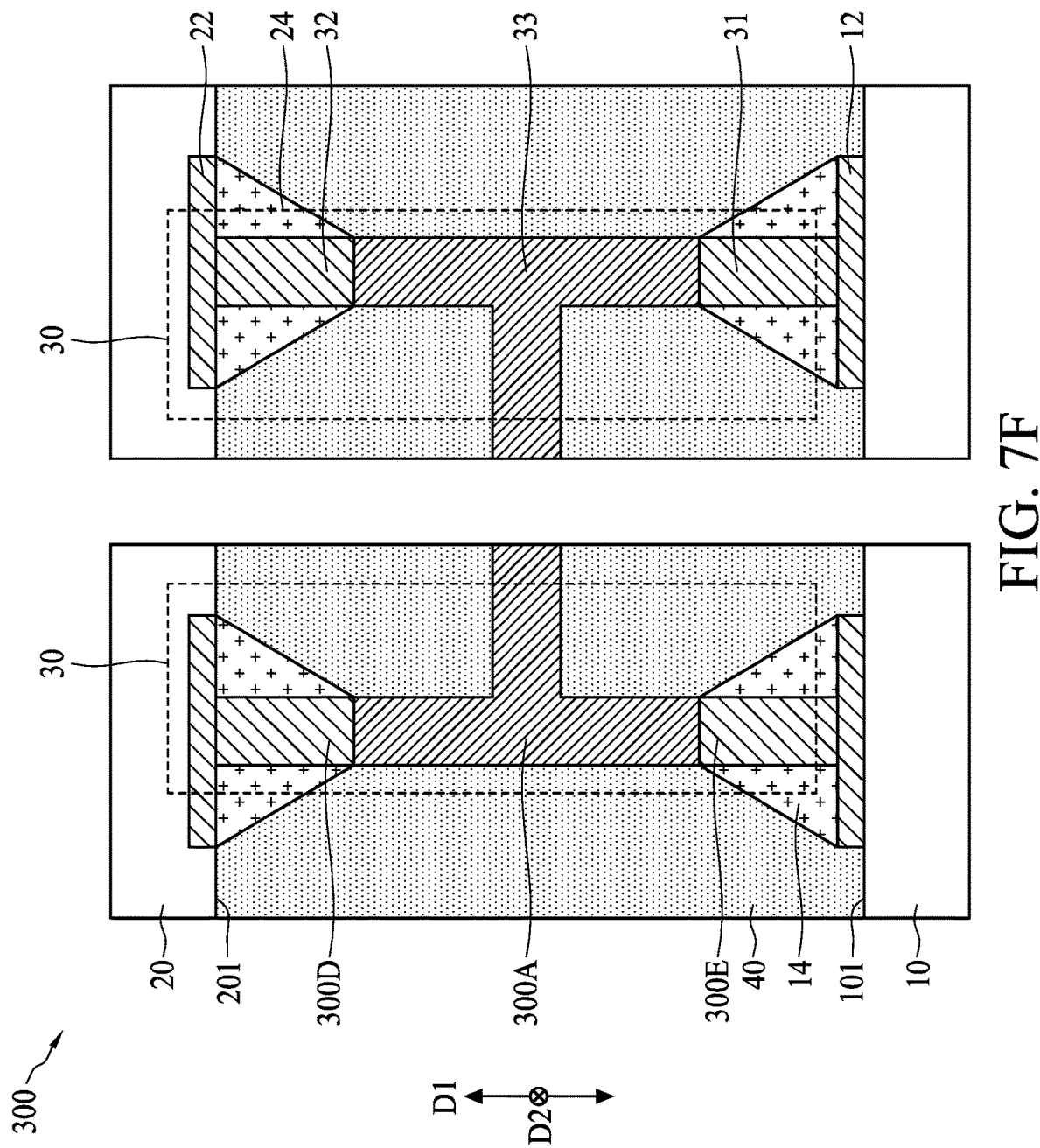

Referring to FIG. 7F, a singulation operation is performed along the spine portion 300A to divide the conductive frame 300 into a plurality of conductive structures 30 as illustrated in FIG. 6, FIG. 6A and FIG. 6B. The conductive frame 300 includes a plurality of conductive structures 30, and thus manufacturing costs can be reduced.

In some embodiments of the present disclosure, the semiconductor device package includes a conductive structure including wetting portions and non-wetting portion. The solders tend to wet on the surface of the wetting portions, but tend to be repelled by the non-wetting portion. Accordingly, the solders on the wetting portions of the conductive structure do not merge, and thus the amounts of the solders disposed on two ends of the conductive structure can be accurately controlled, which minimizes the risks of open-circuitry and short-circuitry, increases the tolerance to warpage, and improves yield and reliability. The conductive structure is a pre-formed structure, which is formed before bonding to the first substrate and the second substrate, and the wetting and/or non-wetting properties may be implemented by partially treating the conductive structure. Accordingly, manufacturing costs can be reduced, and yield can be improved.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. A semiconductor device package, comprising:
   a first substrate;
   a second substrate disposed over the first substrate;
   a conductive structure disposed between the first substrate and the second substrate, wherein the conductive structure is composed of a first wetting portion, a second wetting portion, and a non-wetting portion disposed between the first wetting portion and the second wetting portion;
   an encapsulation layer disposed between the first substrate and the second substrate and entirely encapsulating the non-wetting portion;
   a first solder covering the first wetting portion and connecting the conductive structure to the first substrate; and
   a second solder covering the second wetting portion and connecting the conductive structure to the second substrate.

2. The semiconductor device package of claim 1, wherein a sum of a thickness of the first wetting portion and a thickness of the second wetting portion is greater than a thickness of the non-wetting portion.

3. The semiconductor device package of claim 1, further comprising a plurality of the conductive structures arranged in an array.

4. The semiconductor device package of claim 3, wherein the first wetting portions of the conductive structures form a first row, the second wetting portions of the conductive structures form a second row, and the first row is offset from the second row from a top view perspective and from a cross-sectional view perspective.

5. The semiconductor device package of claim 1, wherein a portion of the first wetting portion is exposed from the first solder.

6. The semiconductor device package of claim 1, wherein the first wetting portion is free from overlapping the second wetting portion from a top view perspective.

7. The semiconductor device package of claim 6, wherein a width of the encapsulation layer is greater than a sum of a width of the first wetting portion and a width of the second wetting portion.

8. The semiconductor device package of claim 1, wherein a thickness of the first wetting portion is greater than half of a thickness of the non-wetting portion.

9. The semiconductor device package of claim 8, further comprising:
a first electronic component, wherein the second substrate is between the first electronic component and the first substrate; and
a second electronic component between the first substrate and the second substrate, wherein a dimension of the second electronic component is greater than a dimension of the first electronic component.

10. The semiconductor device package of claim 1, wherein the first solder outflanks the first wetting portion.

11. The semiconductor device package of claim 10, wherein the second solder outflanks the second wetting portion.

12. The semiconductor device package of claim 1, wherein the encapsulation layer is in contact with the first substrate and the second substrate.

13. The semiconductor device package of claim 12, wherein the encapsulation layer covers a part of the first wetting portion and a part of the second wetting portion.

14. A semiconductor device package, comprising:
a first substrate;
a second substrate disposed over the first substrate;
a conductive structure disposed between the first substrate and the second substrate, wherein the conductive structure comprises a first wetting portion, a second wetting portion, and a non-wetting portion disposed between the first wetting portion and the second wetting portion;
an encapsulation layer disposed between the first substrate and the second substrate;
a first solder covering the first wetting portion and connecting the conductive structure to the first substrate, wherein the first wetting portion inserts into the first solder; and
a second solder covering the second wetting portion and connecting the conductive structure to the second substrate.

15. The semiconductor device package of claim 14, wherein a sum of a thickness of the first wetting portion and a thickness of the second wetting portion is greater than a thickness of the non-wetting portion.

16. The semiconductor device package of claim 14, wherein a portion of the first wetting portion is exposed from the first solder.

17. The semiconductor device package of claim 14, wherein the first wetting portion is free from overlapping the second wetting portion from a top view perspective.

18. The semiconductor device package of claim 14, wherein a thickness of the first wetting portion is greater than half of a thickness of the non-wetting portion.

19. The semiconductor device package of claim 14, wherein the second wetting portion inserts into the second solder.

20. The semiconductor device package of claim 19, wherein the encapsulation layer is in contact with the first substrate and the second substrate.

* * * * *